(12) United States Patent
Yamazaki et al.

(10) Patent No.: US 7,068,246 B2
(45) Date of Patent: Jun. 27, 2006

(54) LIGHT EMITTING MODULE AND METHOD OF DRIVING THE SAME, AND OPTICAL SENSOR

(75) Inventors: Shunpei Yamazaki, Tokyo (JP); Jun Koyama, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 370 days.

(21) Appl. No.: 09/878,862

(22) Filed: Jun. 11, 2001

(65) Prior Publication Data

US 2002/0027229 A1 Mar. 7, 2002

(30) Foreign Application Priority Data

Jun. 12, 2000 (JP) ........................ 2000-176168

(51) Int. Cl.
*G09G 3/30* (2006.01)

(52) U.S. Cl. ............................. 345/76; 345/82; 345/207

(58) Field of Classification Search .................. 345/76, 345/77, 81, 82, 83, 87, 102, 207; 315/169.1, 315/169.3
See application file for complete search history.

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,760,389 A | 7/1988 | Aoki et al. | 340/719 |
| 4,769,292 A | 9/1988 | Tang et al. | 428/690 |
| 4,885,211 A | 12/1989 | Tang et al. | 428/457 |
| 4,950,950 A | 8/1990 | Perry et al. | 313/504 |
| 5,047,687 A | 9/1991 | VanSlyke | 313/503 |
| 5,059,861 A | 10/1991 | Littman et al. | 313/503 |
| 5,059,862 A | 10/1991 | VanSlyke et al. | 313/503 |

(Continued)

FOREIGN PATENT DOCUMENTS

| | | |
|---|---|---|
| EP | 0 717 445 | 6/1996 |
| JP | 04-326849 | 11/1992 |
| JP | 05-241512 | 9/1993 |
| JP | 08-078159 | 3/1996 |
| JP | 08-241048 | 9/1996 |
| JP | 09-304730 | 11/1997 |
| JP | 10-189525 | 7/1998 |
| JP | 2000-235366 | 8/2000 |
| JP | 2001-35655 | 2/2001 |
| TW | 382687 | 2/2000 |
| WO | WO 98/09433 | 3/1998 |
| WO | WO 99/40559 | 8/1999 |
| WO | WO 99/53472 | * 10/1999 |

OTHER PUBLICATIONS

Huan. T.Y. et al, "A New Stack Capacitor for Polysilicon Active Matrix Arrays," IDEM 89, pp. 357–360, (1989).

*Primary Examiner*—Xiao Wu
(74) *Attorney, Agent, or Firm*—Cook, Alex, McFarron, Manzo, Cummings & Mehler, Ltd.

(57) ABSTRACT

The object of the present invention is to provide a light emitting module which is excellent in visibility and can reduce power consumption.

The light emitting module includes a light emitting device containing at least a pixel section 101 and a sensor section 104, which are formed on the same insulating body, and further includes means for sensing illuminance of a use environment with the sensor section 104 and for adjusting luminance of a light emitting element according to the illuminance to keep a ratio of the luminance to the illuminance of the use environment at a constant value.

36 Claims, 17 Drawing Sheets

U.S. PATENT DOCUMENTS

| | | | |
|---|---|---|---|
| 5,061,617 A | 10/1991 | Maskasky | 430/569 |
| 5,073,446 A | 12/1991 | Scozzafava et al. | 428/323 |
| 5,151,629 A | 9/1992 | VanSlyke | 313/504 |
| 5,294,869 A | 3/1994 | Tang et al. | 313/504 |
| 5,294,870 A | 3/1994 | Tang et al. | 313/504 |
| 5,302,966 A | 4/1994 | Stewart | 345/76 |
| 5,406,305 A * | 4/1995 | Shimomura et al. | 345/102 |
| 5,510,851 A | 4/1996 | Foley et al. | 348/658 |
| 5,530,240 A | 6/1996 | Larson et al. | 250/214 |
| 5,617,112 A | 4/1997 | Yoshida et al. | 345/102 |
| 5,702,323 A | 12/1997 | Poulton | 482/8 |
| 5,760,760 A | 6/1998 | Helms | 345/102 |
| 5,831,693 A | 11/1998 | McCartney, Jr. et al. | 349/42 |
| 5,839,456 A | 11/1998 | Han | 134/104.1 |
| 5,956,015 A | 9/1999 | Hino | 345/153 |
| 5,962,962 A | 10/1999 | Fujita et al. | 313/412 |
| 5,990,629 A | 11/1999 | Yamada et al. | 315/169.3 |
| 6,005,350 A | 12/1999 | Hachiya et al. | 315/156 |
| 6,243,069 B1 * | 6/2001 | Ogawa et al. | 345/102 |
| 6,262,767 B1 | 7/2001 | Wakui | 348/211 |
| 6,265,833 B1 | 7/2001 | Kim et al. | 315/169.3 |
| 6,297,791 B1 | 10/2001 | Naito et al. | 345/89 |
| 6,337,675 B1 | 1/2002 | Toffolo et al. | 345/77 |
| 6,392,617 B1 * | 5/2002 | Gleason | 345/82 |
| 6,417,825 B1 | 7/2002 | Stewart et al. | 345/77 |
| 6,424,326 B1 * | 7/2002 | Yamazaki et al. | 345/77 |
| 6,466,334 B1 | 10/2002 | Komiya et al. | 358/1.9 |
| 6,479,940 B1 | 11/2002 | Ishizuka | 315/169.3 |
| 6,518,962 B1 | 2/2003 | Kimura et al. | |
| 6,528,951 B1 | 3/2003 | Yamazaki et al. | |
| 6,535,207 B1 | 3/2003 | Hiroki | 345/207 |
| 2001/0035848 A1 * | 11/2001 | Johnson et al. | 345/76 |
| 2002/0011978 A1 | 1/2002 | Yamazaki et al. | |
| 2002/0033783 A1 | 3/2002 | Koyama | |
| 2002/0044208 A1 | 4/2002 | Yamazaki et al. | |
| 2002/0047550 A1 | 4/2002 | Tanada | |
| 2002/0180672 A1 | 12/2002 | Yamazaki et al. | |
| 2003/0132716 A1 | 7/2003 | Yamazaki et al. | |

* cited by examiner

Analog Driving System

Digital Driving System

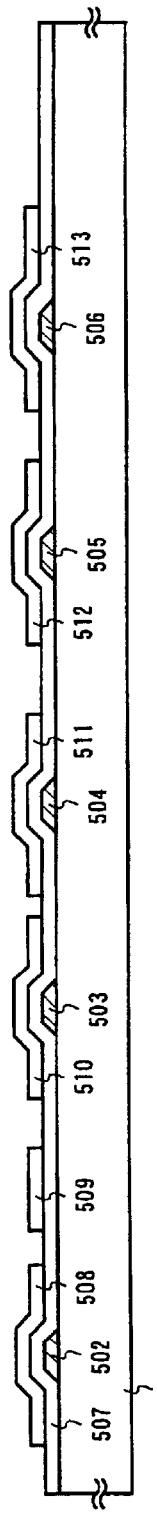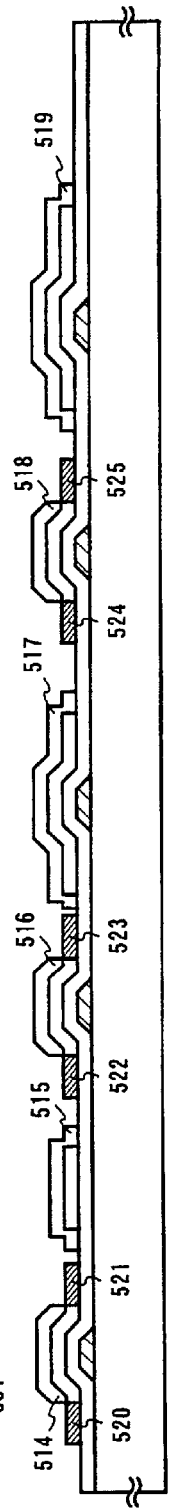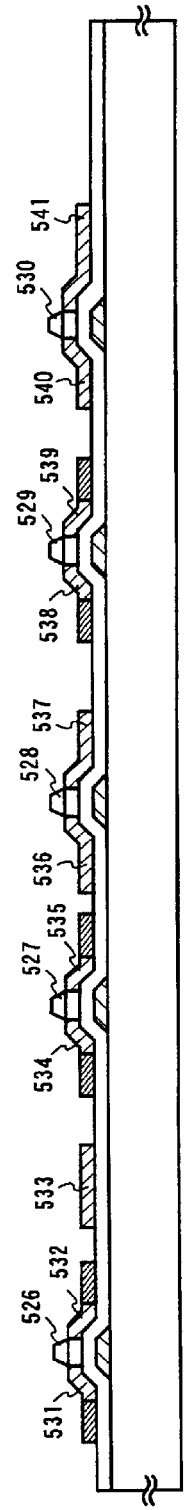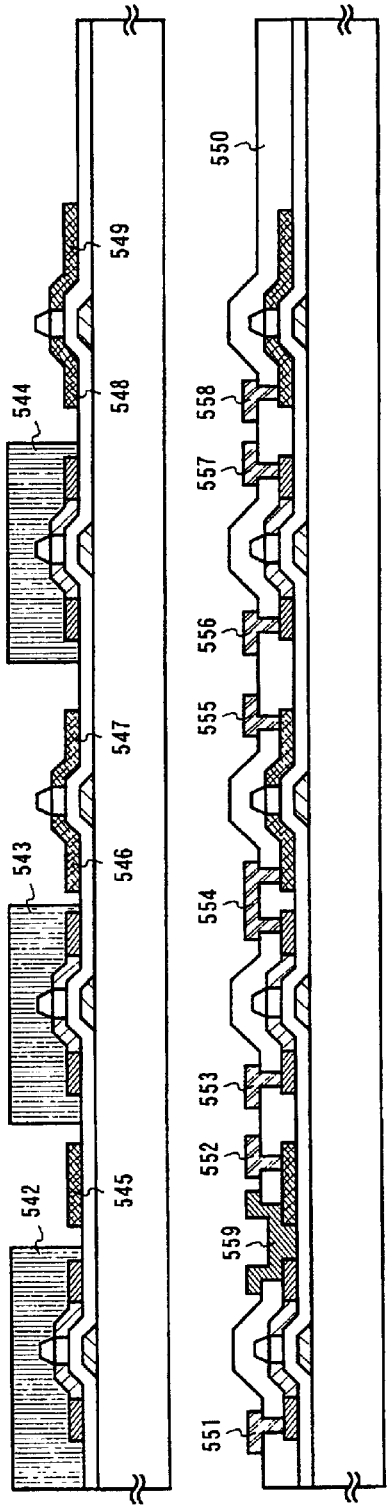

Fig.14A
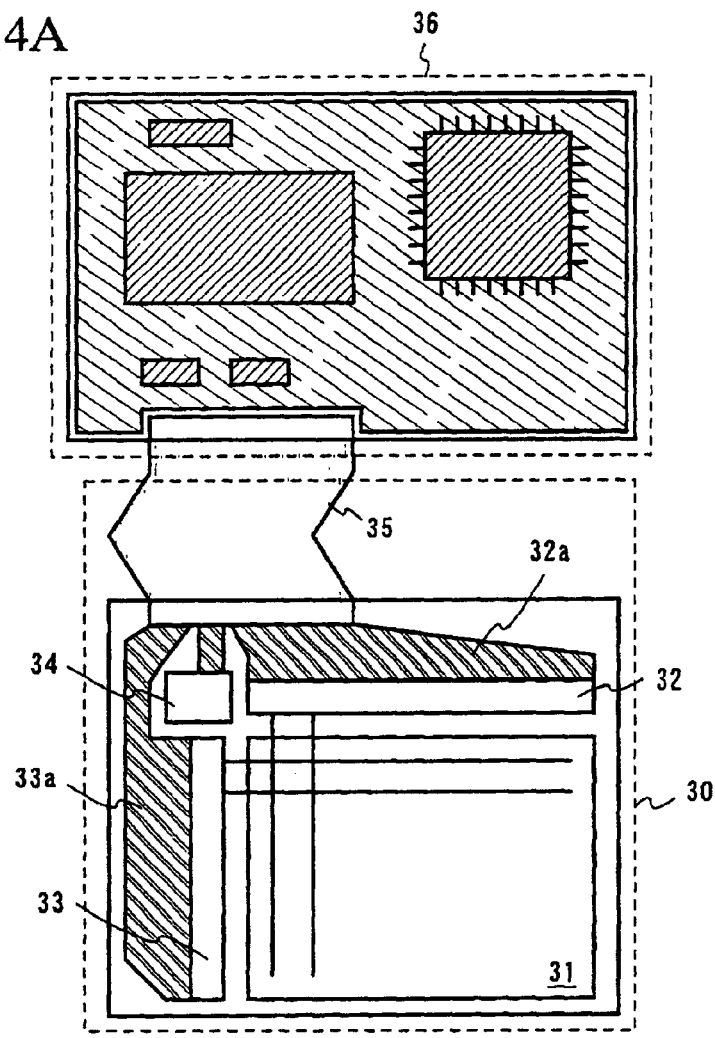
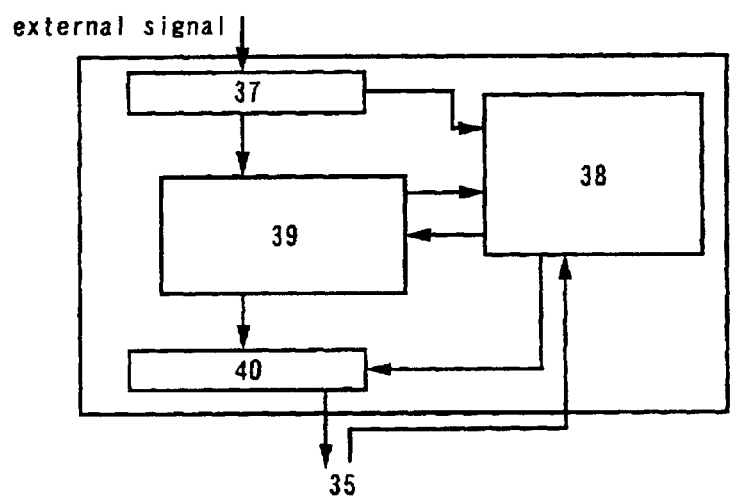
external signal
Fig.14B

LIGHT EMITTING MODULE AND METHOD OF DRIVING THE SAME, AND OPTICAL SENSOR

BACKGROUND OF THE INVENTION

1. Field of the Invention

The present invention relates to a module (hereinafter referred to as a light emitting module) including a device (hereinafter referred to as a light emitting device) comprising an element sandwiching a light emitting material (hereinafter referred to as a light emitting element) between electrodes. In particular, the present invention relates to a light emitting module comprising a light emitting element (hereinafter referred to as an EL element) using a compound producing EL (Electro Luminescence) as the light emitting material. Here, an organic EL display and an organic light emitting diode (hereinafter referred to as an OLED) is included in the light emitting device in accordance with the present invention.

Further, the light emitting material used in the present invention includes all materials emitting light (phosphorescence and/or fluorescence) through singlet excitation, triplet excitation or both of them.

2. Description of the Related Art

In recent years, the development of an EL element using an organic compound (hereinafter referred to as an organic EL film) producing EL (Electro Luminescence) as a light emitting layer has advanced and EL elements using various kinds of organic EL films have been proposed. A flat panel display using such an EL element as a light emitting element has been developed.

A passive matrix type light emitting device and an active matrix type light emitting device have been known as a light emitting device employing an EL element. The passive matrix type light emitting device is a light emitting device employing an EL element with a structure in which an EL film is sandwiched between stripe-like anodes and cathodes provided to intersect at right angles. Also, the active matrix type light emitting device is a light emitting device in which each pixel has a thin film transistor (hereinafter referred to as a TFT) and the TFT connected to one of the anode and the cathode of the EL element controls a current flowing through the EL element.

The passive type light emitting device has an advantage that it has a simple structure which reduces manufacturing costs, but it has a problem that as the pixel is of higher definition (the number of pixels increases), the luminous intensity of the EL element needs to be increased, that is, a larger current is required with results of an increase in power consumption and a reduction in life.

On the other hand, in the active matrix type light emitting device, the pixel is capable of holding data because it is controlled by the TFT and the luminance of the EL element can be made constant irrespective of the number of pixels: that is, the luminance of the EL element can be reduced to a minimum as long as a user can see to prevent an increase in power consumption and a decrease in life.

From the above description, it is thought that the active matrix type light emitting device has smaller power consumption. However, because the active matrix type light emitting device is driven by a current, it is required to decrease the power consumption.

One object of the present invention is to provide a light emitting device having small power consumption and excellent visibility. Further, another object of the present invention is to provide an electrical appliance having a display section employing such a light emitting device and having small power consumption and excellent visibility.

SUMMARY OF THE INVENTION

A light emitting module in accordance with the present invention is characterized in that it includes a sensor section to sense the illuminance of an environment where the light emitting module is used (hereinafter referred to as environmental illuminance) and means for adjusting the luminance of a light emitting element according to the environmental illuminance and for keeping the ratio of the luminance of the light emitting element to the environmental illuminance (contrast ratio between the luminance of the light emitting element and the environmental illuminance) at a constant value.

In other words, the light emitting module in accordance with the present invention is characterized in that the luminance of an EL element can be increased in a bright use environment to improve visibility and that the luminance of the EL element can be decreased in a dark use environment to reduce power consumption without degrading visibility.

It is recommended that the environmental illuminance be sensed (monitored) by an optical sensor. The present invention is characterized also in that a sensor section including one or a plurality of optical sensors (typically, photodiodes) and a pixel section for displaying an image are formed on the same insulating body. That is, the present invention is characterized also in that the sensor section including photodiodes is formed with the same process as a transistor (including a thin film transistor and a MOS transistor using bulk silicon) and the EL element on the pixel section.

In the light emitting module in accordance with the present invention, the environmental illuminance is sensed by the sensor section formed in the light emitting device, and the correct luminance of the EL element and a correction signal which is necessary for obtaining the correct luminance of the EL element are calculated by a correction circuit based on the output signal of the sensor section. Then, the amount of current flowing through the EL element is corrected based on the correction signal to keep the ratio of the luminance of the EL element to the environmental illuminance (contrast ratio) at a constant value.

The light emitting module in accordance with the present invention is excellent in visibility in a bright environment because of a sufficiently bright display and reduces power consumption in a dark environment because it is possible to decrease brightness to a minimum while ensuring good visibility. Therefore, an electric appliance employing the light emitting module in accordance with the present invention has excellent visibility in a display section and can reduce power consumption.

BRIEF DESCRIPTION OF THE DRAWINGS

Preferred embodiments of the present invention will be described in detail based on the following figures, in which:

FIGS. 5A to 5E show the manufacturing process of a light emitting module;

FIGS. 14A and 14B show the structure of a light emitting module having an external controller;

DESCRIPTION OF THE PREFERRED EMBODIMENTS

Figure 1A:
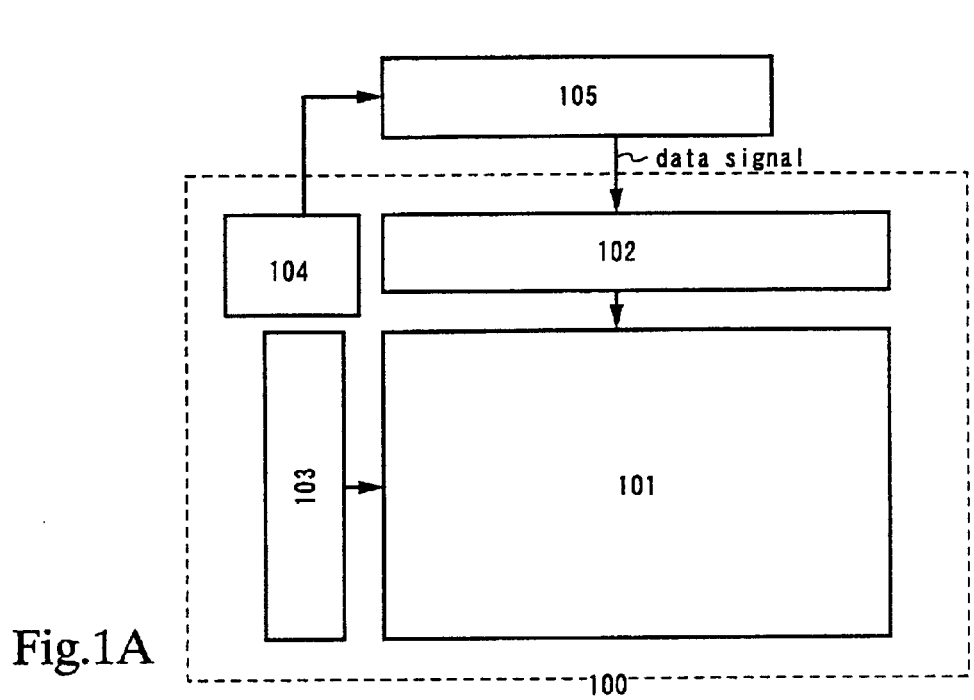
FIGS. 1A to 1C show the configuration of a light emitting module.

The preferred embodiments in accordance with the present invention will be described. FIG. 1A is a circuit block diagram of a light emitting module in accordance with the present invention. A light emitting device 100 includes a pixel section 101, a data signal (video signal) side driving circuit 102, gate signal side driving circuit 103, and a sensor section 104, and a correction circuit 105 is connected to the light emitting device 100. The correction circuit 105 has an arithmetic circuit for computing the luminance of the light emitting element of the pixel section 101 based on a signal transmitted by the sensor section 104.

A monolithic IC, a hybrid IC, or a MCM (Multi Chip Module) may be used as the correction circuit 105. When the monolithic IC is used, it may be directly packaged into the light emitting device 100 and may be packaged on a TAB (Tape Automated Bonding) tape and be connected to the light emitting device 100 as a TCP (Tape Carrier Package). Also, when the hybrid IC or the MCM is used, it is recommended to be connected to the light emitting device 100 with the use of the TAB tape.

Figure 1B:
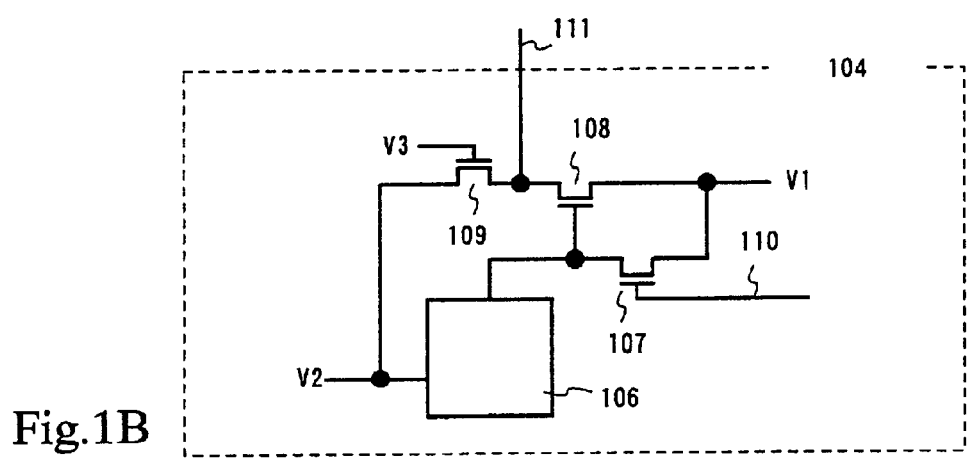

Next, FIG. 1B shows one example of a circuit configuration of the sensor section 104. Here, the sensor section 104 includes a photodiode 106, a reset TFT 107, a buffer TFT 108, and a constant current TFT 109.

The reset TFT 107 is a TFT for applying a reverse bias voltage to the photodiode 106 to return (reset) to the initial state, and a timing of returning to the initial state is controlled by a signal transmitted to a reset signal line 110 which is a gate. Further, the buffer TFT 108 is a TFT for amplifying a signal sensed by the photodiode 106 and the constant current TFT 109 is a TFT which functions as a constant current power source. Here, the buffer TFT 108 and the constant current TFT 109 function as a source follower and an output signal is transmitted to an output line 111.

Here, constant voltages V1 to V3 are fixed voltages applied to the photodiode 106, the reset TFT 107, the buffer TFT 108, and the constant current TFT 109. Typically, a power source voltage or an earth voltage is employed as the fixed voltage.

Here, the circuit configuration shown in FIG. 1B is one example and any publicly known circuit configuration may be employed providing that the circuit configuration functions as an optical sensor. Further, while the TFT is used as an active device in this example, in the case where the pixel section is formed of a MOS transistor (a transistor with a MOS structure formed on a semiconductor substrate), naturally, the MOS transistor is used.

Figure 1C:
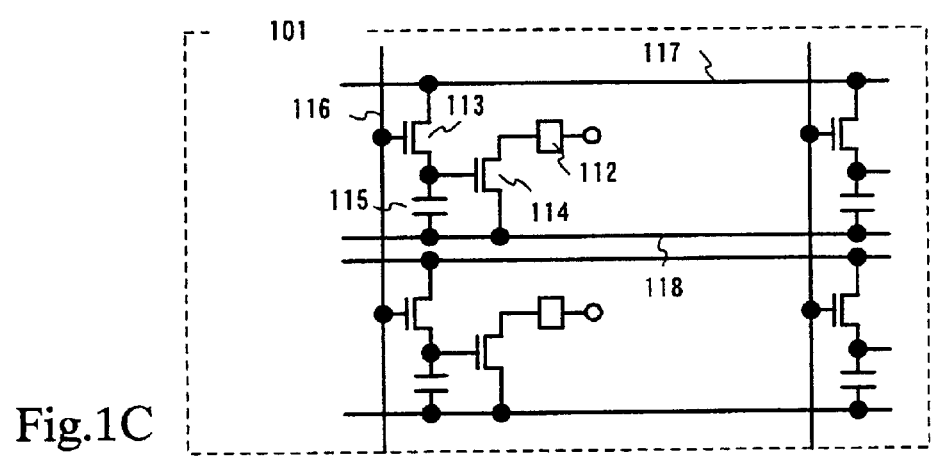

Next, FIG. 1C shows one example of a circuit configuration of the pixel section 101. Here, the pixel section 101 includes an EL element 112, a switching TFT 113, a current control TFT 114, and a capacitor 115.

The switching TFT 113 is a TFT for controlling the gate of the current control TFT 114 and transmits a signal transmitted to a data line (video line) 117 to the gate of the current control TFT 114 by using a gate line 116 as a gate. Also, the current control TFT 114 is a TFT for controlling a current flowing through the EL element 112 and transmits a signal transmitted to a current supply line 118 to the EL element 112.

Here, the circuit configuration shown in FIG. 1C is one example and any publicly known circuit configuration may be employed if the circuit configuration can control the light emission of the EL element. Further, while the TFT is used as an active device in this example, there may be the case where the pixel section is formed of the MOS transistor.

Figure 2:
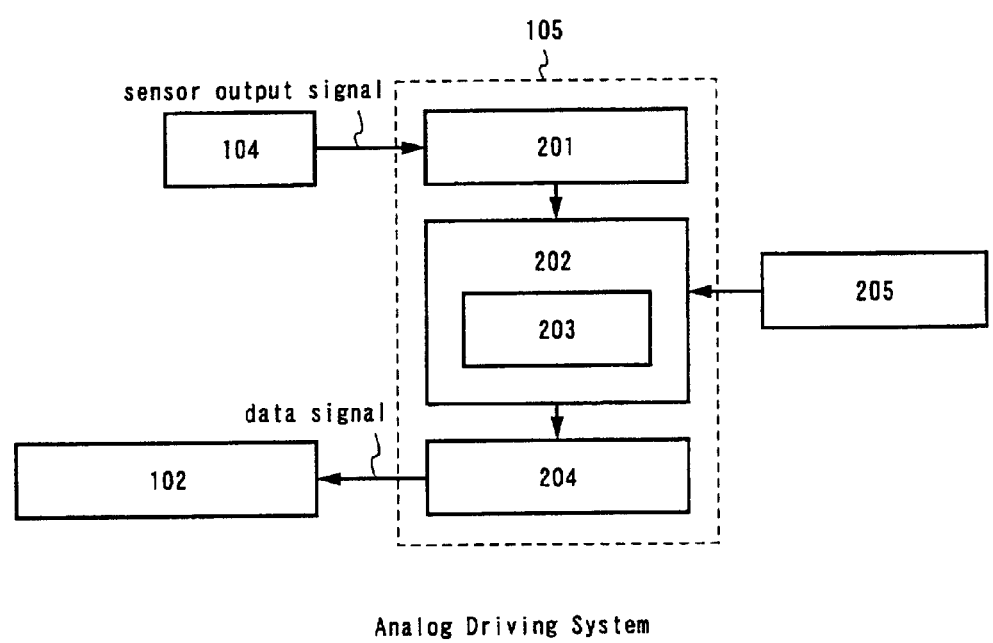
FIG. 2 shows the configuration of a correction circuit.
Figure 3:
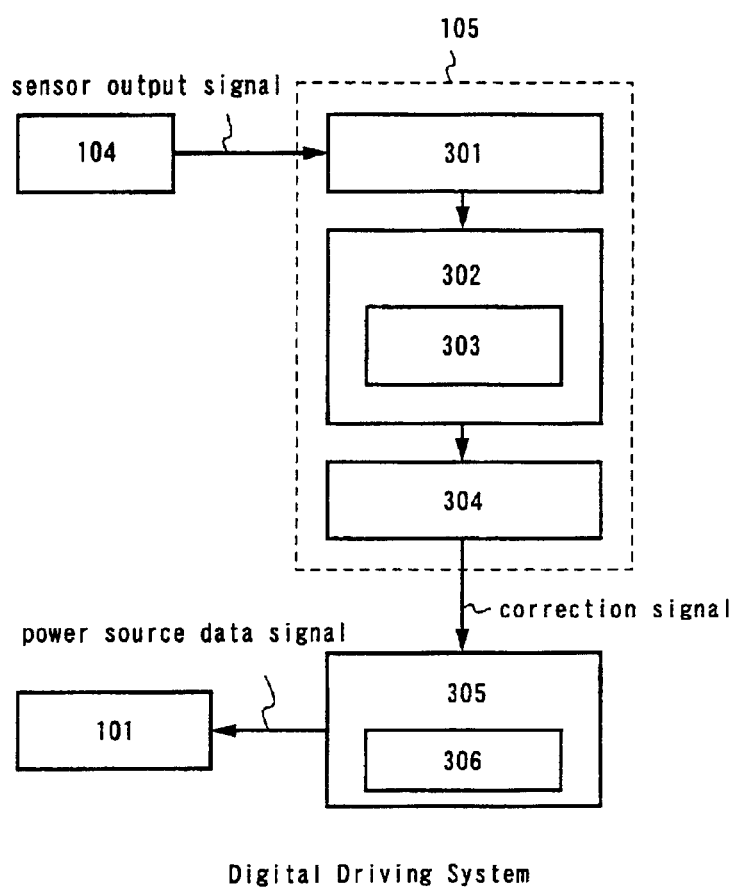
FIG. 3 shows the configuration of a correction circuit.

Next, examples of the configuration of the correction circuit 105 will be shown in FIG. 2 and FIG. 3. Here, FIG. 2 is a case where the light emitting device 100 is driven by an analog signal (analog driving system) and FIG. 3 is a case where the light emitting device 100 is driven by a digital signal (digital driving system).

In FIG. 2, the correction circuit 105 includes an A/D conversion circuit (A/D converter) 201, an arithmetic circuit 202, a correction memory 203, and a D/A conversion circuit (D/A converter) 204. Here, it is preferable that the arithmetic circuit 202 and the correction memory 203 are formed of the MCM because the MCM can increase the transmission speed of data.

Here, the correction memory 203 is a memory for storing correction data for correcting the luminance of the EL element so as to make the ratio of luminance to environmental illuminance constant, that is, a memory for storing (memorizing) correct value data of luminance corresponding to the environmental illuminance so as to ensure a constant contrast ratio of the luminance to the environmental illuminance. Of course, it is necessary to previously get and store the correct value data of the luminance corresponding to the environmental illuminance.

Here, the flow of a signal in the case of the analog driving system shown in FIG. 2 will be described. In the case of the analog driving system, a signal which determines the amount of current to the EL element is a signal transmitted to the data line 117 in FIG. 1C.

Data of environmental illuminance transmitted from the sensor section 104 (sensor output signal) is converted into a digital signal by the A/D conversion circuit 201 and is inputted to the arithmetic circuit 202. The arithmetic circuit 202 calculates a correct value of a data signal (video signal) for obtaining correct luminance with respect to the environmental illuminance based on the inputted sensor output signal and the data stored in the correction memory 203.

In this manner, the data signal (video signal) from a signal generator 205 is corrected to the correct value based on the sensor output signal and the data stored in the correction memory 203, and the corrected data signal is again converted into an analog signal by the D/A conversion circuit 204 and is inputted to the data signal side driving circuit 102.

Next, the flow of a signal in the case of the digital driving system shown in FIG. 3 will be described. In the case of the digital driving system, a signal which determines the amount of current to the EL element is a signal transmitted to the current supply line 118 in FIG. 1C.

Data of environmental illuminance transmitted from the sensor section 104 (sensor output signal) is converted into a digital signal by the A/D conversion circuit 301 and is inputted to the arithmetic circuit 302. The arithmetic circuit 302 calculates a correct value of the amount of current which is necessary for obtaining correct luminance with respect to the environmental illuminance based on the inputted sensor output signal and the data stored in the correction memory 303, and a correction signal with its information is outputted.

In this manner, the correction signal calculated based on the sensor output signal and the data stored in the correction memory 303 is converted into an analog signal by the D/A conversion circuit 304 and is inputted to an EL driving power source 305. The EL driving power source 305 is a power source of a signal (hereinafter referred to as a power source data signal) transmitted to the current supply line of the pixel section 101, and a power source for finally determining a current flowing to the EL element. A voltage varying device 306 is connected to the EL driving power source 305 and a power source data signal is corrected based on the correction signal transmitted from the correction circuit 105 and the corrected power source data signal is inputted to the pixel section 101.

In this manner, first, the environmental illuminance is sensed by the sensor section 104 provided in the light emitting device and the correction circuit 105 calculates a data signal or a correction signal which is necessary for obtaining the correct luminance of the EL element based on the output signal (sensor output signal). Then, the amount of current flowing to the EL element is corrected based on this data signal or correction signal to produce luminance of a correct contrast ratio.

The light emitting module described in the preferred embodiment in accordance with the present invention is excellent in visibility in a bright environment because of a sufficiently bright display and reduces power consumption in a dark environment because it is possible to reduce brightness to a minimum while ensuring good visibility. Accordingly, in an electric appliance using a light emitting module of the present invention, a display is excellent in visibility and power consumption is reduced.

(Embodiments)
(Embodiment 1)

In the present embodiment, a cross-sectional structure (in a state before sealing) included in a light emitting module in accordance with the present invention will be described. In the present embodiment, there will be described an example of a light emitting device (in a state before sealing) which has a sensor section, a pixel section, and a driving circuit for driving the pixel section on the same insulating body. Here, the sensor section shows a reset TFT and a photodiode connected to the reset TFT, and the driving circuit shows a CMOS circuit which is a basic unit, and the pixel section shows one pixel.

Figure 4:
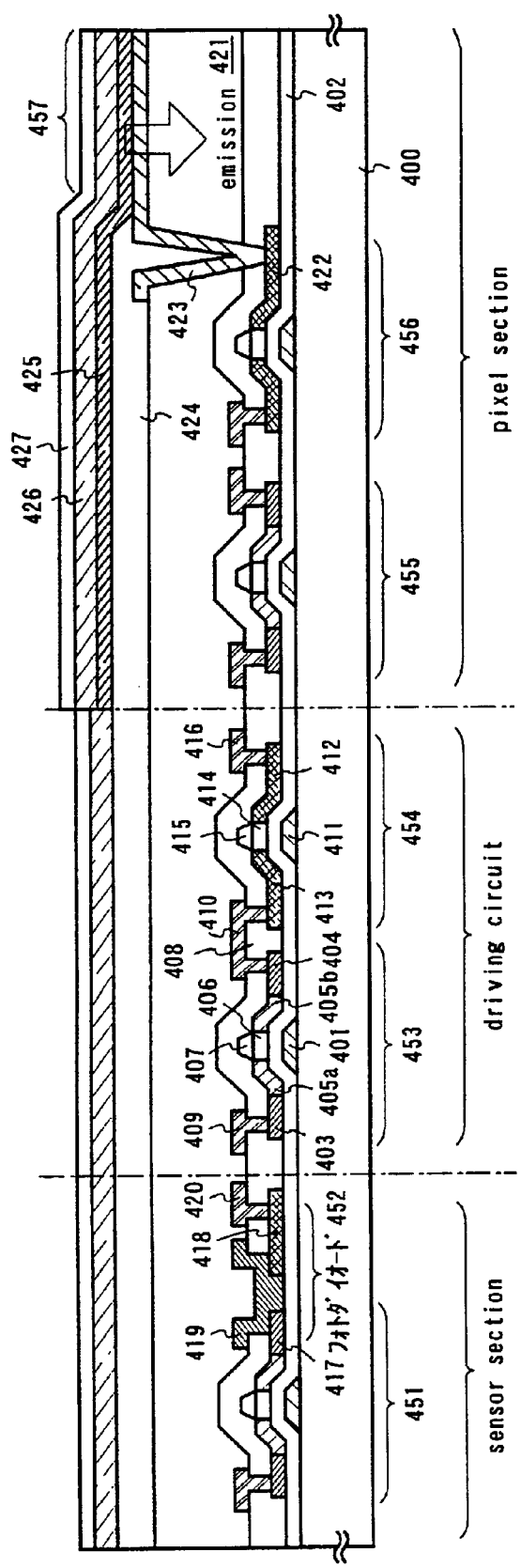
FIG. 4 shows the cross-sectional structure of a light emitting module.

In FIG. 4, a reference numeral 400 is an insluting body (made of an insulating substrate, an insulating film, or a substrate with an insulating film on the surface) on which a sensor section, a driving circuit, and a pixel section are formed. The sensor section is provided with a reset TFT 451 and a photodiode 452. Also, the driving circuit has an n-channel type TFT 453 and a p-channel type TFT 454 which constitute a CMOS circuit. Further, the pixel section has a switching TFT 455, a current control TFT 456, and an EL element 457. In this respect, the respective TFTs may be TFTs with any publicly known structure. In the present embodiment, the respective TFTs are bottom gate type TFTs (specifically, inverse stagger type TFT), but top gate type TFTs (typically, planar type TFT) may be used.

Further, the circuit configuration of the sensor section in the present embodiment has a structure shown in FIG. 1B and the circuit configuration of the pixel section has a structure shown in FIG. 1C. However, not only such a circuit configuration but also a circuit with three or more TFTs can produce the effects of the present invention.

Here, the structures of the respective TFTs formed on the insulating body 400 will be described. In the n-channel type TFT 453, a reference numeral 401 designates a gate electrode, 402 designates a gate insulating film, 403 designates a source region made of an n-type semiconductor region (hereinafter referred to as n-type region), 404 designates a drain region made of an n-type region, 405a and 405b designate an LDD (lightly doped drain) region, 406 designates a channel forming region, 407 designates a channel protecting film, 408 designates a first interlayer insulating film, 409 designates a source wiring, and 410 designates a drain wiring.

Further, in the p-channel type TFT 454, a reference numeral 411 designates a gate electrode, 402 designates a gate insulating film, 412 designates a source region made of a p-type semiconductor region (hereinafter referred to as p-type region), 413 designates a drain region made of a p-type region, 414 designates a channel forming region, 415 designates a channel protecting film, 408 designates a first interlayer insulating film, 416 designates a source wiring, and 410 designates a drain wiring which is a wiring common to the n-channel type TFT 453.

Further, basically, the reset TFT 451 has the same structure as the n-channel type TFT 453 (they are different from each other only in the structure of the source wiring or the drain wiring) and hence the detailed description thereof will be omitted. Here, it is also possible that the reset TFT 451 has the same structure as the p-channel type TFT 454. In the case of the reset TFT 451, an amorphous semiconductor film (typically, an amorphous silicon film) 419 is formed between a drain region 417 made of an n-type region and a p-type region 418 to form a photodiode 452 with a PIN junction. Here, a reference numeral 420 designates a wiring for applying voltage to the p-type region 418.

Further, basically, the switching TFT 455 has the same structure as the n-channel type TFT 453 and hence the detailed description thereof will be omitted. Here, it is also possible to form the switching TFT 455 with the same structure as the p-channel type TFT 454. Further, it is also possible to form the switching TFT 455 with a structure in which two or more channel forming regions are formed between the source region and the drain region (multi-gate structure).

Further, basically, the current control TFT 456 has the same structure as the p-channel type TFT 454 (they are different from each other in that the drain wiring is a pixel electrode 423) and hence the detailed description thereof will be omitted. Here, it is also possible to form the current control TFT 456 having the same structure as the n-channel type TFT 453.

Then, there is formed a second interlayer insulating film (leveling film) 421 covering the reset TFT 451, the photodiode 452, the n-channel type TFT 453, the p-channel type TFT 454, the switching TFT 455, and the current control TFT 456.

Still further, the second interlayer insulating film 421 has a contact hole extending to the drain region 422 of the current control TFT 456 and a pixel electrode 423 is connected to the drain region 422. The pixel electrode 423 functions as an anode of the EL element and is formed of a conductive film with a large work function, typically, an oxide conductive film. It is recommended that the oxide conductive film be made of indium oxide, tin oxide, zinc oxide, or a compound thereof. Also, gallium oxide may be added to the oxide conductive film.

Next, a reference numeral 424 designates an insulating film covering the end portion of the pixel electrode 423 and is called a bank in the present specification. It is recommended that the bank 424 be formed of an insulating film containing silicon or a resin film. In the case of using the resin film, a dielectric breakdown can be prevented in the film formation if carbon particles or metal particles are added to the resin film so that the specific resistance of the resin film becomes from $1 \times 10^6$ Ωm to $1 \times 10^{12}$ Ωm (preferably, from $1 \times 10^8$ Ωm to $1 \times 10^{10}$ Ωm).

Next, a reference numeral 425 designates an EL layer. In this respect, in the present specification, a laminated body of a combination of layers selected from a hole injection layer, a hole transport layer, a hole prevention layer, an electron transport layer, an electron injection layer and an electron prevention layer is defined as an EL layer with respect to a light emitting layer. The light emitting layer may be formed of any publicly known material and a publicly known dopant (typically, fluorescent dye) may added to the light emitting layer. Further, it is preferable that an organic material which emits light through triplet excitation is used as the dopant since high luminous efficiency can be produced.

Next, a reference numeral 426 designates a cathode of the EL element and is formed of a conductive film with a small work function. It is recommended that a conductive film containing an element which belongs to the first or second group of a periodic table be used as the conductive film with a small work function. In the present embodiment, a conductive film made of a compound of lithium and aluminum is used.

In this respect, a laminated body 457 of the pixel electrode (anode) 423, the EL layer 425, and the cathode 426 is an EL element. Light generated by the EL element 457 is emitted to the insulating body 400 (in the direction shown by an arrow in FIG. 4). Also, in the case of using the p-channel type TFT as the current control TFT, as described in the present embodiment, it is preferable that the anode of the EL element is connected to the drain of the current control TFT.

In this respect, it is effective that a protective film (passivation film) 427 completely covering the EL element 457 is formed after the cathode 426 is formed. A single layer of an insulating film of a carbon film, a silicon nitride film, or a silicon nitride oxide film or a laminated layer of a combination of the above insulating films is used as the protective film 427.

Here, it is preferable that a film with good coverage is used as the protective film 427, and a carbon film, a DLC (diamond like carbon) film in particular, is effectively used. The DLC film can be formed in a temperature range of the room temperature to 100° C. and hence can be easily formed also on the EL layer 425 with low heat resistance. Further, the DLC film has a high blocking effect to oxygen and it is possible to effectively prevent oxidation of the EL layer 425. Accordingly, the DLC film can prevent the EL layer 425 from being oxidized during the following sealing process.

Here, a manufacturing process for producing the structure shown in FIG. 4 will be shown in FIG. 5. First, gate electrodes 502 to 506 are formed of chromium film on a glass substrate 501 and a gate insulating film 507 is formed thereon of a silicon nitride oxide film (insulating film expressed by $SiO_xN_y$). An amorphous silicon film is formed on the gate insulating film 507 and crystallized by laser annealing to form semiconductor films 508 to 513 of a crystalline silicon film by patterning. The process up to this point may be performed by using the publicly known materials and technology (see FIG. 5A).

Here, the distance between the semiconductor film 508 and the semiconductor film 509 is not more than 1 μm, preferably, from 0.3 μm to 0.5 μm.

Next, insulating films 514 to 519 made of a silicon oxide film are formed on the semiconductor films 508 to 513 and phosphorus or arsenic is added thereto by the publicly known method. In this way, n-type regions 520 to 525 are formed. The n-type regions 520 to 525 contain phosphorus or arsenic with a concentration of $1 \times 10^{20}$ atoms/cm$^3$ to $1 \times 10^{21}$ atoms/cm$^3$ (see FIG. 5B).

Next, the insulating films 514 to 519 are patterned by back-surface lithography with using the gate electrodes 502 to 506 as masks to form insulating films (channel protecting film) 526 to 530. Then, in this state, phosphorus or arsenic is again added thereto by the publicly known method. In this way, n-type regions 531 to 541 are formed. The n-type regions 531 to 541 contain phosphorus or arsenic with a concentration of $1 \times 10^{17}$ atoms/cm$^3$ to $1 \times 10^{19}$ atoms/cm$^3$ (see FIG. 5C).

Next, resist films 542 to 544 are formed and boron is added thereto by the publicly known method. In this way, p-type regions 545 to 549 are formed. The p-type regions 545 to 549 contain boron with a concentration of $3 \times 10^{20}$ atoms/cm$^3$ to $5 \times 10^{21}$ atoms/cm . Here, although phosphorus or arsenic is already added to the p-type regions 545 to 549, the concentration of boron is three or more times that of phosphorus or arsenic and hence the p-type regions 545 to 549 are completely inverted from n type to p type. (see FIG. 5D).

Next, the resist films 542 to 544 are removed and a first interlayer insulating film 550 with a laminated structure of a silicon oxide film and a silicon nitride oxide film is formed. Contact holes are made in the first interlayer insulating film 550 and wirings 551 to 558 with a laminated structure of molybdenum and tungsten are formed. Then, a conversion layer 559 made of a semiconductor film is formed. The conversion layer 559 is a layer for absorbing light and generating carriers in the photodiode and corresponds to the i- layer (photoelectric conversion layer) of a solar cell. (see FIG. 5E).

In this respect, a publicly known layer structure with a PIN junction can be used as the conversion layer 559. Also, the conversion layer 559 may have a PIN junction or a NIP junction in viewing from the incident side of light. Further, an amorphous semiconductor film, a crystalline semiconductor film, or a microcrystalline semiconductor film may be used as the material of the conversion layer 559.

Then, as shown in FIG. 4, a second interlayer insulating film 421, a pixel electrode 423, a bank 424, an EL layer 425, a cathode 426, and a protective film 427 are formed to complete a light emitting device with a cross-sectional structure shown in FIG. 4.

If a light emitting device with the cross-sectional structure of the present embodiment is employed, it is possible to provide a light emitting module which is excellent in visibility in the bright environment and can ensure good visibility while reducing power consumption in the dark environment. Here, in the present embodiment, the configurations shown in FIG. 1 and FIG. 2 or FIG. 1 and FIG. 3 may be combined.

(Embodiment 2)

In the present embodiment, there will be described an example of a light emitting device (however, in the state before sealing) with a structure different from the embodiment 1. Here, in the present embodiment, description will be made in the different parts from the embodiment 1. The description of the embodiment 1 may be referred to on parts with the same reference symbols as the parts in FIG. 4.

Figure 6:
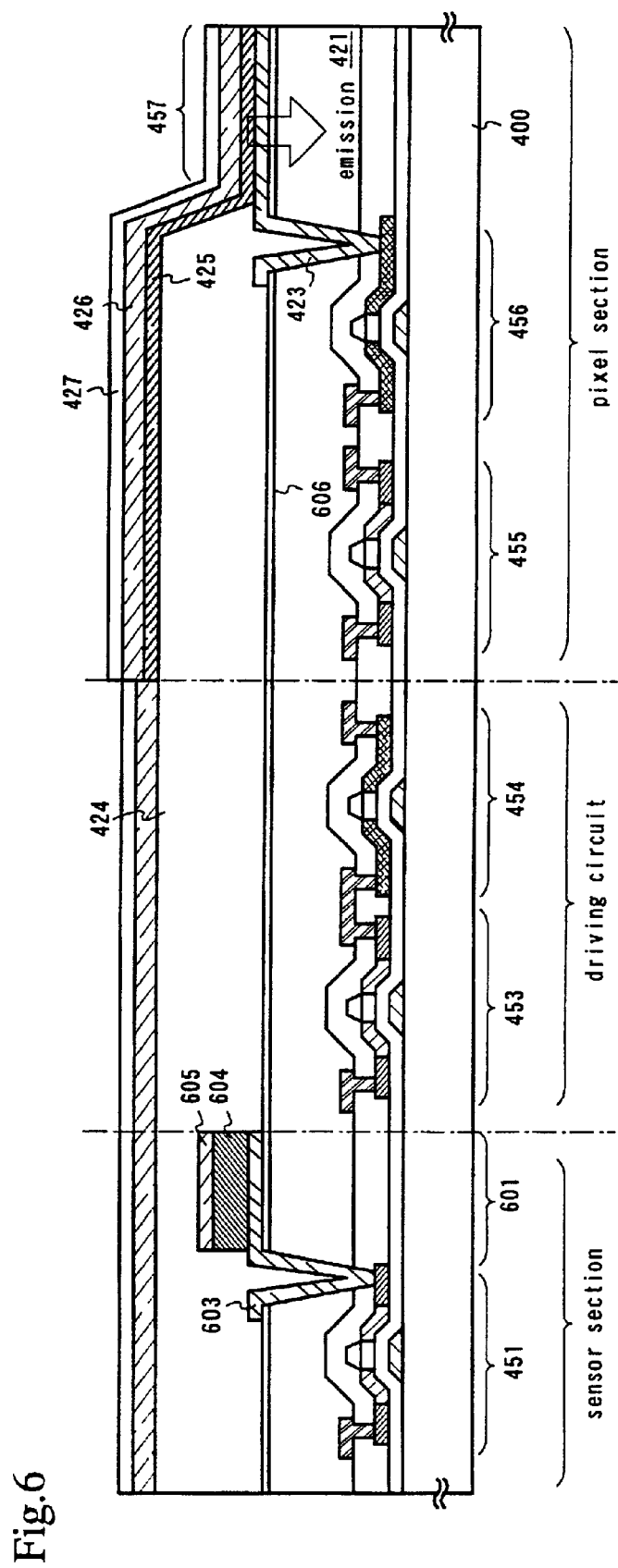
FIG. 6 shows the cross-sectional structure of a light emitting module.

In FIG. 6, a sensor section, a driving circuit, and a pixel section are formed on an insulating body 400. The sensor section includes a reset TFT 451 and a photodiode (photosensor) 601, and the driving circuit includes a CMOS circuit comprising an n-channel type TFT 453 and a p-channel type TFT 454, and the pixel section includes a switching TFT 455, a current control TFT 456, and an EL element 457.

The present embodiment is different from the embodiment 1 in the structure of the photodiode 601. The photodiode is formed of a wiring 603 which is to be the source or drain of the reset TFT 451, a conversion layer 604, and a reflection side electrode (electrode at the reflecting side of light) 605. Also, in the present embodiment, a buffer layer 606 made of an insulating film containing silicon is formed on a second interlayer insulating film 421. The buffer layer 606 makes the wiring 603 put into close contact with the second interlayer insulating film 421 and allows second interlayer insulating film 421 to be prevented from being etched when the conversion layer 604 is formed.

Here, the wiring 603 is transparent with respect to visible light because it is formed by the same process as the pixel electrode 423. Also, a conductive film to be the reflection side electrode is preferably a conductive film with a high reflectivity, and it is recommended that a conductive film containing aluminum or silver as a main component be used. Here, if an oxide conductive film is formed as a buffer layer between the conversion layer 604 and the reflection side electrode 605, the conversion layer 604 can be prevented from reacting with the reflection side electrode 605.

If a light emitting device with the cross-sectional structure of the present embodiment is employed, it is possible to provide a light emitting module which is excellent in visibility in the bright environment and can ensure good visibility while reducing power consumption in the dark environment. Here, in the present embodiment, the configurations shown in FIG. 1 and FIG. 2 or FIG. 1 and FIG. 3 may be combined.

(Embodiment 3)

In the present embodiment, there will be described an example of a light emitting device (however, in the state before sealing) with a different structure from the embodiment 1. Here, in the present embodiment, description will be made in the different parts from the embodiment 1. The description of the embodiment 1 may be referred to on parts with the same reference symbols as the parts in FIG. 4.

Figure 7:
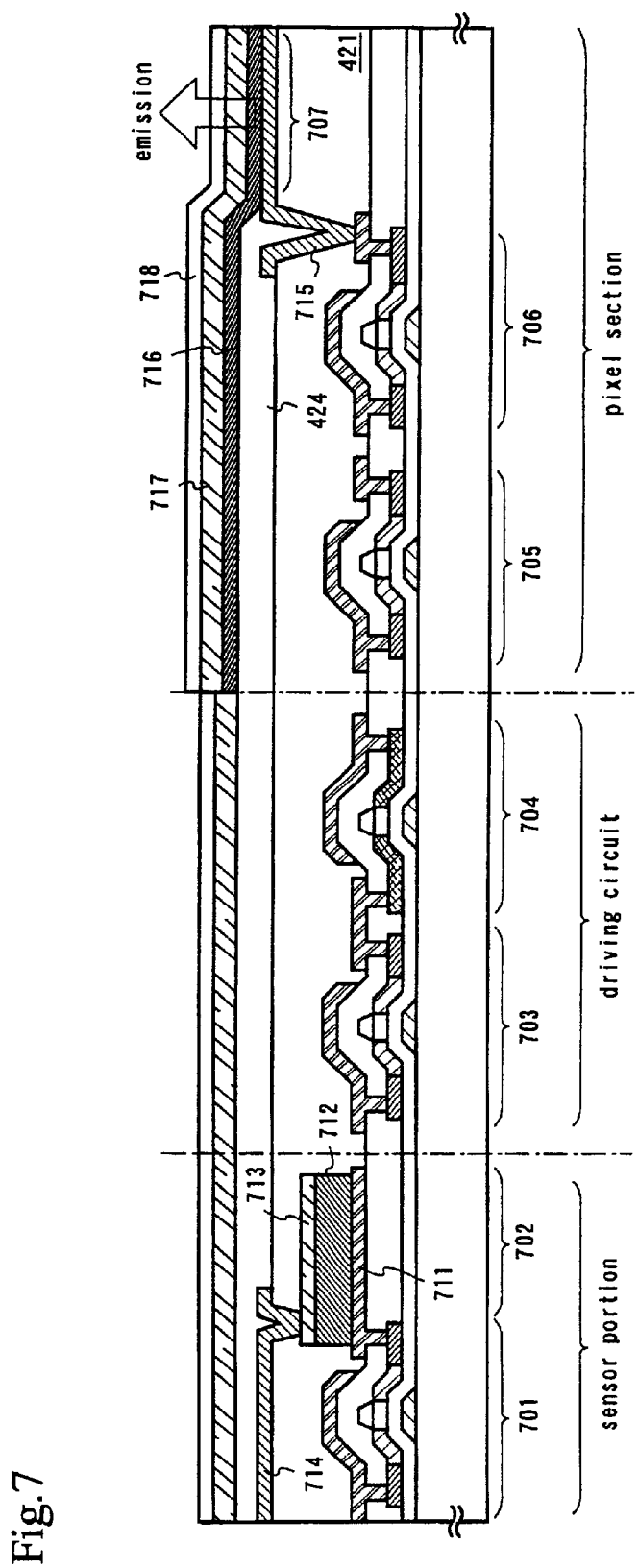
FIG. 7 shows the cross-sectional structure of a light emitting module.

In FIG. 7, a sensor section, a driving circuit, and a pixel section are formed on an insulating body 400. The sensor section includes a reset TFT 701 and a photodiode (photosensor) 702, and the driving circuit includes a CMOS circuit comprising an n-channel type TFT 703 and a p-channel type TFT 704, and the pixel section includes a switching TFT 705, a current control TFT 706, and an EL element 457.

First, the present embodiment is characterized in that the source line or the drain line of each TFTs is formed so as to cover a channel region. The structure of the present embodiment is formed in the shape shown in FIG. 7 in order to obstruct light which directly enters to the channel forming region of the TFT to prevent an increase in leakage current.

Further, in the present embodiment, an n-channel type TFT is used as a current control TFT 706. Here, the current control TFT 706 has basically the same structure as the n-channel type TFT 453 shown in FIG. 4 (they are different from each other only in the shape of a source electrode), so the detailed description thereof will be omitted. Here, the current control TFT 706 can have the same structure as the p-channel type TFT 454 shown in FIG. 4.

Still further, the present embodiment is different from the embodiment 1 in the structure of a photodiode 702 and the photodiode 702 is formed of a wiring 711 to be the source or drain of the reset TFT 701, a conversion layer 712, and a transmission side electrode (electrode at the side where light transmits) 713, and a leader line 714 is connected to the transmission side electrode 713. The conversion layer 712 can be formed in the same configuration as the conversion layer 604 of the embodiment 2. Also, it is recommended that the transmission side electrode 713 be formed of an oxide conductive film.

In a pixel section, a pixel electrode 715 is formed in the same process as the leader line 714. The pixel electrode 715 is an electrode which functions as the cathode of an EL element 707 and is formed of a conductive film containing an element which belongs to the first group or the second group of the periodic table. In the present embodiment, a conductive film made of a compound of lithium and aluminum is used. Here, in the case where a cathode is connected to the current control TFT as described in the present embodiment, it is preferable that an n-channel type TFT is used as the current control TFT.

After the pixel electrode 715 is formed, an insulating film (bank) 424, an EL layer 716, an anode 717 made of an oxide conductive film, and a protective film 718 are formed to complete a light emitting device (however, in the state before sealing) with the structure shown in FIG. 7. It is recommended that the material and the structure of the EL layer 716, the anode 717, and the protective film 718 be referred to the embodiment 1.

If a light emitting device with the cross-sectional structure of the present embodiment is employed, it is possible to provide a light emitting module which is excellent in visibility in the bright environment and can ensure good visibility while reducing power consumption in the dark environment. Here, in the present embodiment, the configurations shown in FIG. 1 and FIG. 2 or FIG. 1 and FIG. 3 may be combined.

(Embodiment 4)

In the present embodiment, there will be described an example of a light emitting device (however, in the state before sealing) with a different structure from the embodiment 1. Here, in the present embodiment, description will be made in the different parts from the embodiment 1. The description of the embodiment 1 may be referred to on parts with the same reference symbols as the parts in FIG. 4.

Figure 17:
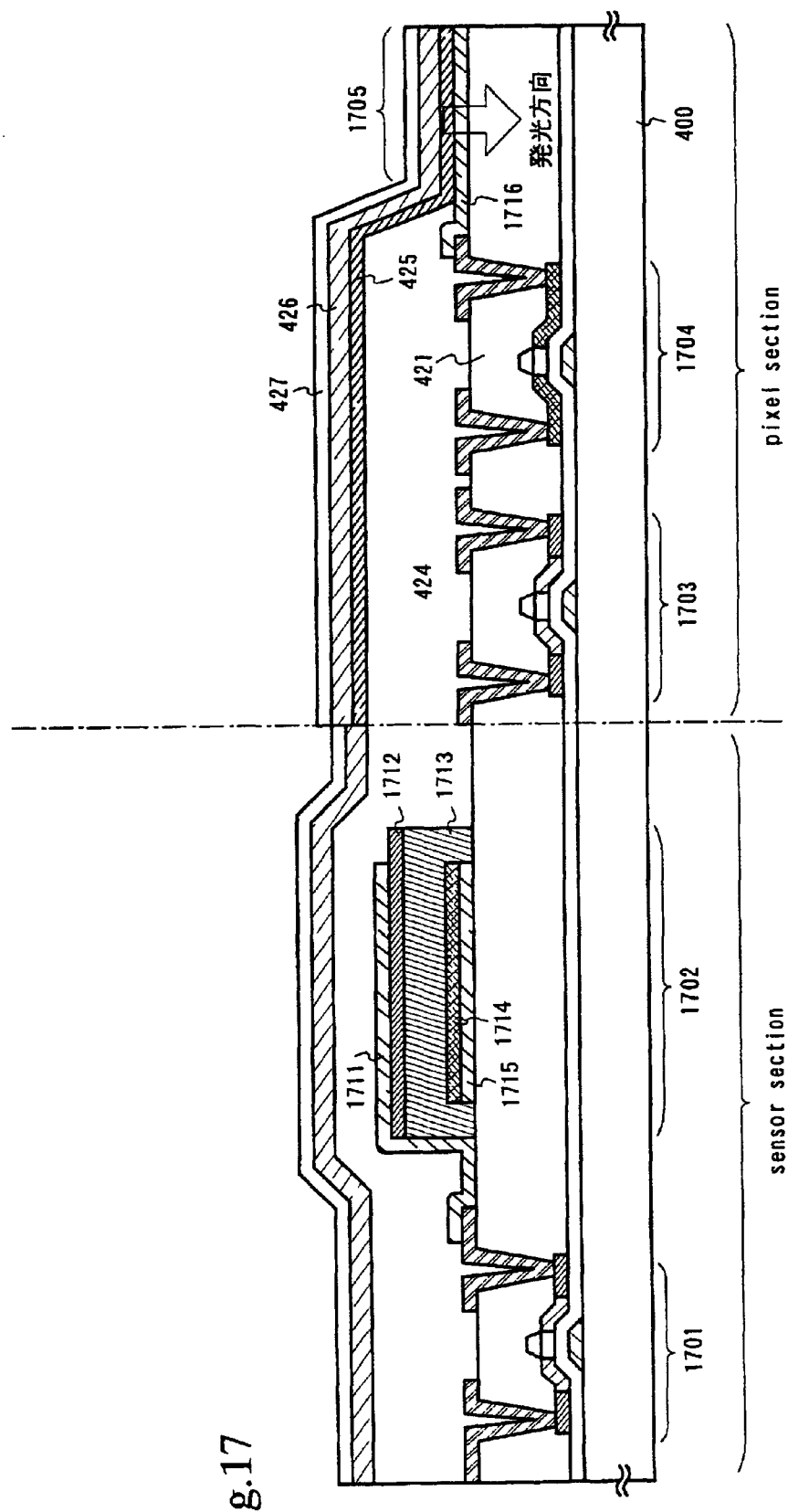
FIG. 17 shows the cross-sectional structure of a light emitting module.

In FIG. 17, a sensor section and a pixel section are formed on an insulating body 400. Here, a driving circuit can be formed on the same insulating body as the embodiment 2 or the embodiment 3.

The sensor section includes a reset TFT 1701 and a photodiode (photosensor) 1702 and the pixel section includes a switching TFT 1703, a current control TFT 1704, and an EL element 1705.

In the present embodiment, a p-channel type TFT is used as the current control TFT 1704. Here, the current control TFT 1704 basically has the same structure as the current control TFT 456 shown in FIG. 4 and, hence, the detailed description will be omitted. Here, the current control TFT 1704 can also have the same structure as the n-channel type TFT 455 shown in FIG. 4.

Further, the present embodiment is different from the embodiment 1 in the structure of the photodiode 1702, and the photodiode 1702 is formed of a wiring 1711 made of an oxide conductive film to be the source or the drain of the reset TFT 1701, an n-type semiconductor layer 1712, a conversion layer (i-type semiconductor layer) 1713, a p-type semiconductor layer 1714, and a light receiving side electrode (electrode at the side where light is received) 1715.

Here, the wiring 1711 is formed in the same process as the pixel electrode (anode of the EL element 1705) 1716. Also, the light receiving side electrode 1715 may be formed of an oxide conductive film. Here, in the pixel section, the pixel electrode 1716 formed in the same process as the wiring 1711 is electrically connected to the drain of the current control TFT 1704.

After the pixel electrode 1716 is formed, an insulating film (bank) 424, an EL layer 425, a cathode 426, and a protective film 427 are formed to complete a light emitting device (however, in the state before sealing) with the structure shown in FIG. 17. It is recommended that the material and the structure of the EL layer 425, the cathode 426, and the protective film 427 be referred to the embodiment 1.

If a light emitting device with the cross-sectional structure of the present embodiment is employed, it is possible to provide a light emitting module which is excellent in visibility in the bright environment and can ensure good visibility while reducing power consumption in the dark environment. Here, in the present embodiment, the configurations shown in FIG. 1 and FIG. 2 or FIG. 1 and FIG. 3 may be combined.

(Embodiment 5)

In the present embodiment, a light emitting device, in which a sensor section, a correction circuit, a driving circuit, and a pixel section are formed on the same insulating body, will be described.

Figure 8:
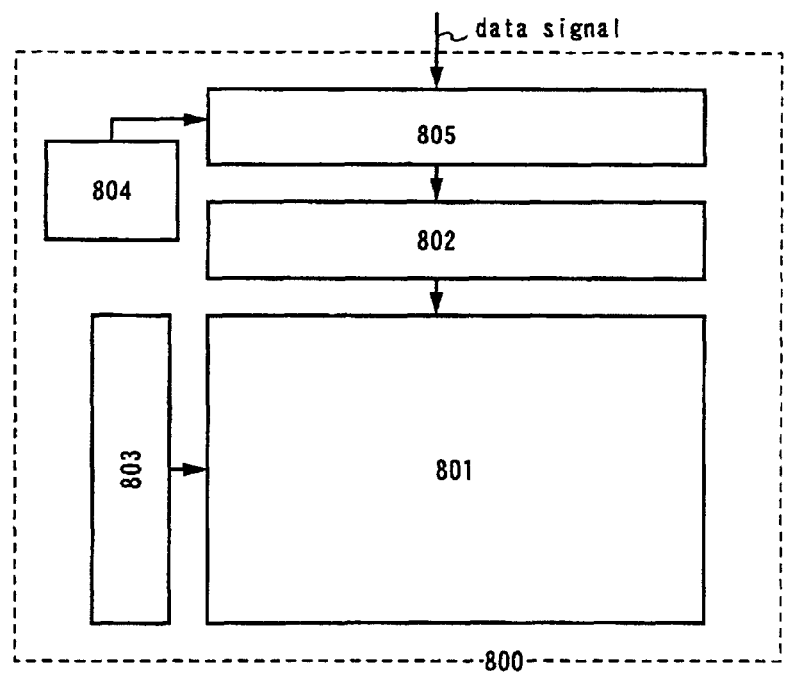
FIG. 8 shows the configuration of a light emitting module.

In FIG. 8, a reference numeral 800 designates a light emitting device of the present embodiment, 801 designates a pixel section, 802 designates a data signal side driving circuit, 803 designates a gate signal side driving circuit, 804 designates a sensor section, and 805 designates a correction circuit. Here, it is recommended that the configuration of the pixel section 801 be referred to FIG. 1C and that the configuration of the sensor section 804 be referred to FIG. 1B.

The present embodiment is characterized in that the correction circuit 805 with the configuration shown in FIG. 2 or FIG. 3 is formed on the same insulating body as the sensor section, the driving circuit, the pixel section. That is, in the light emitting device 800 of the present embodiment, a corrected data signal is outputted from a correction circuit 805 based on the environmental illuminance sensed by the sensor section 804 to adjust the luminance of the pixel section 801 to a correct intensity.

Of course, in the configuration of the present embodiment, the correction circuit 805 is formed only of transistors (TFT or MOS transistor). Here, it is recommended that the correction circuit be designed by using a CMOS circuit comprising the n-channel type TFT 453 and p-channel type TFT 454 in FIG. 4 as a basic section.

In this respect, the configuration of the present embodiment can be carried out with any of the configurations of the embodiment 1 to the embodiment 4. Since the light emitting module including the light emitting device of the present embodiment has a built-in correction circuit, the weight can be reduced as compared with the structure shown in FIG. 1 and the number of pins which is necessary for connecting the correction circuit to the driving circuit can be reduced.

(Embodiment 6)

A circuit which functions as an optical sensor (photo sensor) can be used as a sensor section included in a light emitting module of the present invention. In the present embodiment, examples of the circuit configuration of an active type optical sensor will be shown in FIGS. 9A and 9B.

Figure 9A:
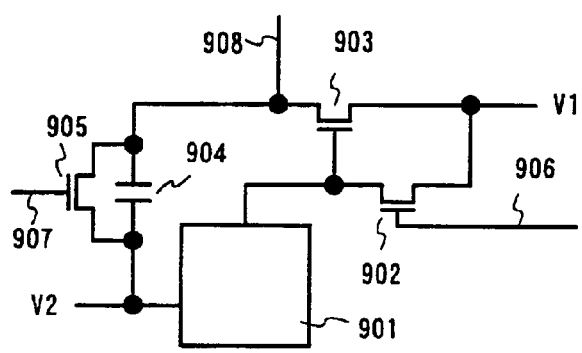
FIGS. 9A and 9B show the configuration of an optical sensor.

The optical sensor shown in FIG. 9A includes a photodiode 901, a first reset TFT 902, a buffer TFT 903, a load capacitance 904, a second reset TFT 905. Also, a first reset signal line 906 is connected to the gate of the first reset TFT 902 and a second reset signal line 907 is connected to the gate of the second reset TFT 905. Further, a reference numeral 908 designates an output line.

Figure 9B:
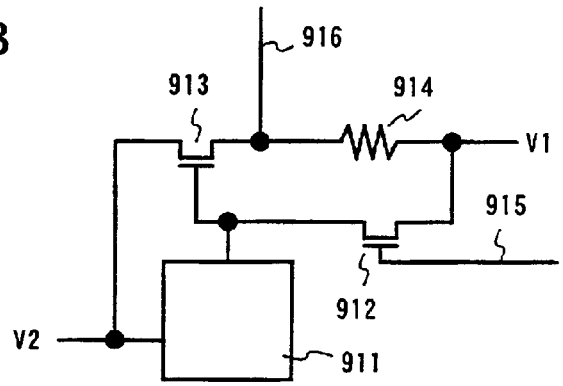

Further, the optical sensor shown in FIG. 9B includes a photodiode 911, a reset TFT 912, a buffer TFT 913, a load resistance (or a load capacitance) 914. Also, a reset signal line 915 is connected to the gate of the reset TFT 912. Further, a reference numeral 916 designates an output line.

Here, in FIGS. 9A and 9B, constant voltages V1 and V2 are the fixed voltages applied to the photodiode, the reset TFT, and the buffer TFT. Typically, a power source voltage or an earth voltage is employed as the fixed voltage.

One or a plurality of optical sensors with the circuit configuration shown in FIG. 9A or FIG. 9B may be provided in the sensor section of the light emitting module in accordance with the present invention. Further, the circuit configurations shown in FIGS. 9A and 9B are simply examples. While the TFTs are used as active elements here, a MOS transistor is used naturally in the case where the pixel section is formed of the MOS transistor. Still further, in the case where the TFT is used, a top gate type TFT or a bottom gate type TFT may be used.

In this respect, the configuration of the present embodiment can be carried out with any of the configurations of the embodiment 1 to the embodiment 5.

(Embodiment 7)

A circuit which functions as an optical sensor can be used as a sensor section included in a light emitting module of the present invention. In the present embodiment, an example of the circuit configuration of an passive type optical sensor will be shown in FIG. 10.

Figure 10:
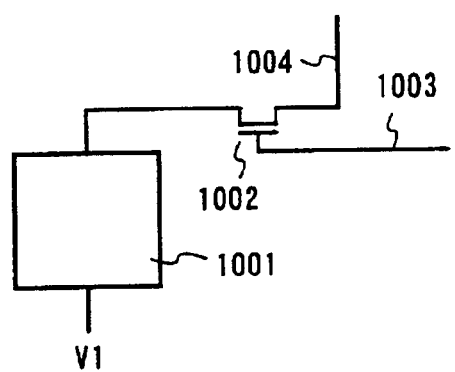
FIG. 10 shows the configuration of an optical sensor.

The optical sensor shown in FIG. 10 includes a photodiode 1001 and a reset TFT 1002. Also, a reset signal line 1003 is connected to the gate of the reset TFT 1002. Further, a reference numeral 1004 designates an output line.

Here, in FIG. 10, a constant voltage V1 is the fixed voltage applied to the photodiode. Typically, a power source voltage or an earth voltage is employed as the fixed voltage.

One or a plurality of optical sensors with the circuit configuration shown in FIG. 10 may be provided in the sensor section of the light emitting module in accordance with the present invention. Further, the circuit configurations shown in FIG. 10 is simply an example. While the TFTs are used as active elements here, a MOS transistor is used naturally in the case where the pixel section is formed of the MOS transistor. Still further, in the case where the TFT is used, a top gate type TFT or a bottom gate type TFT may be used.

In this respect, the configuration of the present embodiment can be carried out with any of the configurations of the embodiment 1 to the embodiment 5.

(Embodiment 8)

In the present embodiment, the case will be described, where a structure of a pixel in a pixel section is different in from the FIG. 1B. Here, the description of FIG. 1B may be referred to on the parts with the same reference symbols as in FIG. 1B.

Figure 11A:
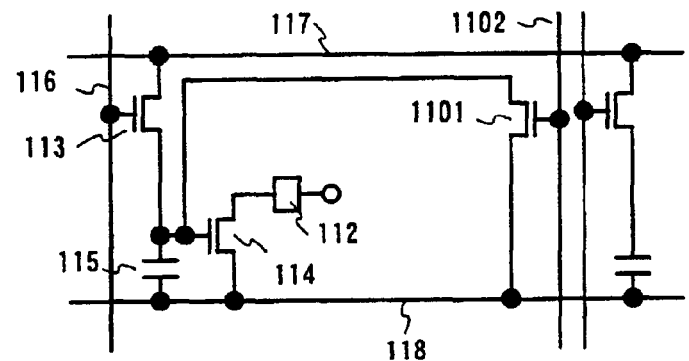
FIGS. 11A and 11B show the configuration of a pixel section of a light emitting module.

The configuration shown in FIG. 11A is characterized in that an erasing TFT 1101 is disposed between a switching TFT 113 and the gate of a current control TFT 114. The erasing TFT 1101 is a TFT for forcibly transforming the gate voltage applied to the current control TFT 114 to 0 volt. One of the source and drain of the erasing TFT 1101 is connected to the gate of a current control TFT 114 and the other is connected to the current supply line 118 and the gate thereof is connected to a wiring (erasing gate line) 1102 to be the gate of the erasing TFT 1101.

Figure 11B:
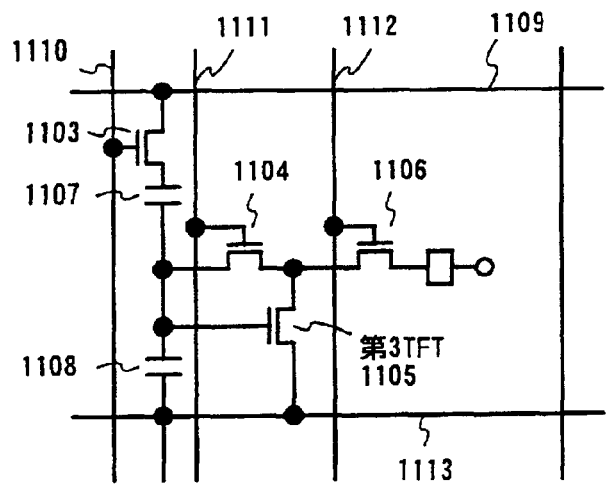

Further, the configuration shown in FIG. 11B is a publicly known configuration in which a first TFT 1103, a second TFT 1104, a third TFT 1105, a fourth TFT 1106, a first capacitor 1107 and a second capacitor 1108 are provided. Still further, there is provided a data line 1109, a first gate line 1110, a second gate line 1111, a third gate line 1112, and a current supply line 1113 as shown in FIG. 11B in order to transmit signals to the respective TFTs.

A plurality of pixels with the circuit configuration shown in FIG. 11A or 11B may be formed in the pixel section of the light emitting module in accordance with the present embodiment. Further, the circuit configurations shown in FIG. 11A and 11B are simply examples. While the TFTs are used as active elements here, the pixel section may be formed of MOS transistors. Still further, a top gate type TFT or a bottom gate type TFT may be used.

In this respect, the configuration of the present embodiment can be carried out with any of the configurations of the embodiment 1 to the embodiment 7.

(Embodiment 9)

In a light emitting module in accordance with present invention, it can make an operating frequency reduced to drive a data signal side driving circuit by a publicly known split driving method. The split driving method is a driving method for reducing the operating frequency by writing a data signal in a plurality of pixels at the same time in performing a driving method by a dot sequential type driving method.

In this case, n data signals (video signals) are necessary for split-driving by n splits. A data signal is written in a block of n pixels in synchronization with the output timing of a shift register. In this way, the operating frequency of the data signal side driving circuit can be reduced to 1/n.

Further, it is possible to write a data signal every n pixels in synchronization with the output timing of a shift register. Also in this case, the operating frequency of the data signal side driving circuit can be reduced to 1/n.

In this respect, the configuration of the present embodiment can be carried out with any of the configurations of the embodiment 1 to the embodiment 7.

(Embodiment 10)

In the present embodiment, a light emitting module in accordance with the present invention after a sealing process for protecting an EL element will be described with reference to FIGS. 12A and 12B. Here, the sealing structure of the present embodiment can be applied to any structure shown in the embodiment 1 to the embodiment 4. The reference symbols in FIG. 4 are referred to if necessary.

Figure 12A:
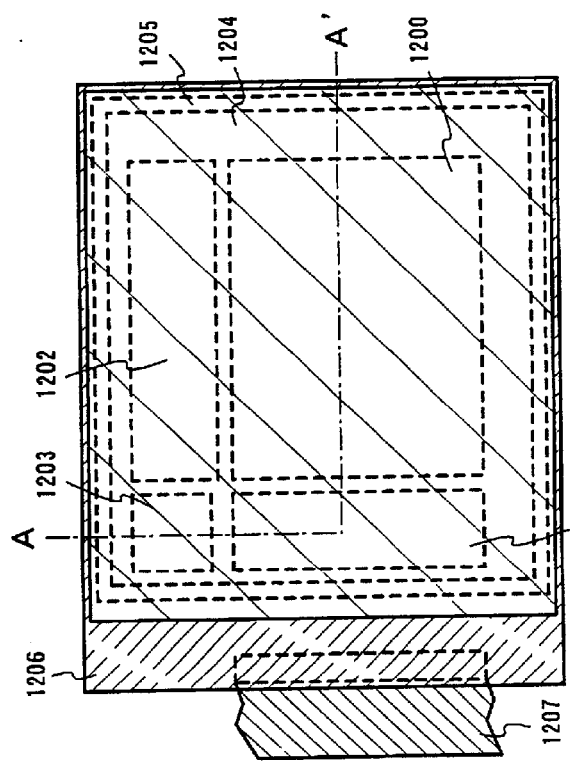
FIGS. 12A and 12B show the top structure and cross-sectional structure of a light emitting module.
Figure 12B:
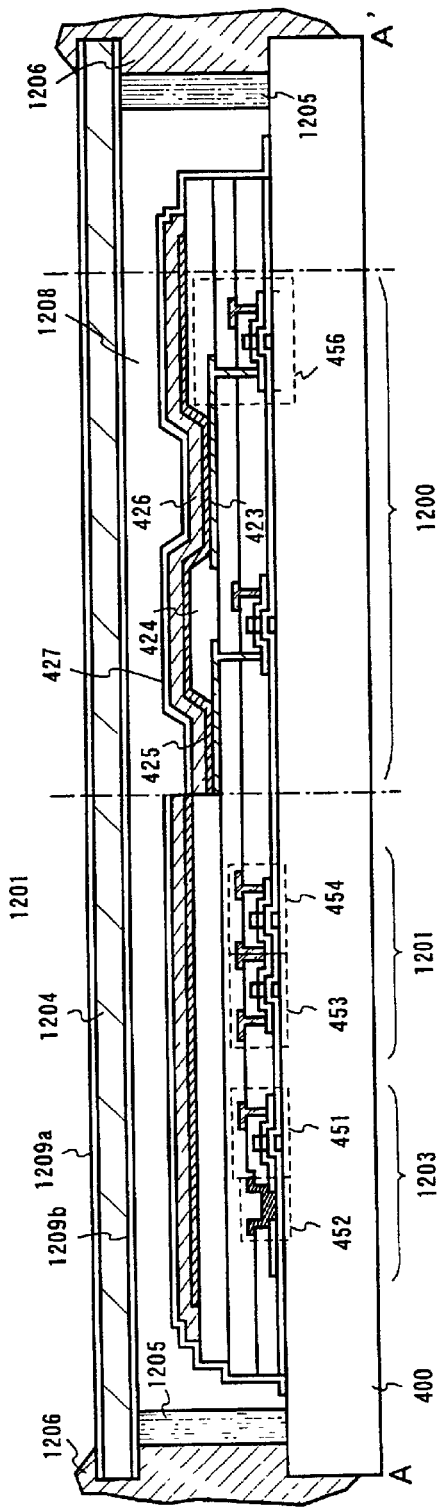

FIG. 12A is a plan view to show a state in which the process has been advanced to the step of sealing the EL element and FIG. 12B is a cross-sectional view taken on line A—A' in FIG. 12A. A section 1200 indicated by a dotted line is a pixel section and a section 1201 is a source signal side driving circuit and a section 1202 is a gate signal side driving circuit and a section 1203 is a sensor section. Also, a reference numeral 1204 designates a covering member and 1205 designates a first sealing member and 1206 designates a second sealing member.

Further, a reference numeral 1207 designates a TAB tape to be an external input terminal that receives a video signal or a clock signal from an external driving circuit and a correction circuit. Here, while only the TAB is shown, the TAB tape may be provided with a printed wiring board (PWB) or be a TCP.

Next, the cross-sectional structure will be described with reference to FIG. 12B. On an insulating body 400 are formed a pixel section 1200, a source signal side driving circuit 1201 and a sensor section 1203. The pixel section 1200 includes a plurality of pixels each of which includes a current control TFT 456 and a pixel electrode 423 electrically connected to the drain of the current control TFT 456. Further, the source signal side driving circuit 1201 includes a CMOS circuit made of a combination of an n-channel type TFT 453 and a p-channel type TFT 454. Still further, the sensor section 1203 includes a photodiode 452 connected to a reset TFT 451. Here, a polarizing plate (typically, a circular polarizing plate) may be placed to the insulating body 400.

The pixel electrode 423 functions as the anode of the EL element. Also, banks 424 are formed on both ends of the pixel electrode 423, and an EL layer 425 and the cathode 426 of the EL element are formed on the pixel electrode 423. The cathode 426 functions also as a wiring common to all the pixels and finally is electrically connected to a TAB tape 1207. Further, all the elements included in the pixel section 1200, the source signal side driving circuit 1201, and the sensor section 1203 are covered with a protective film 427.

Further, the covering member 1204 is placed to the insulating body 400 with the first sealing member 1205. Here, a spacer may be provided so as to ensure a gap between the covering member 1204 and the EL element. A space 1208 is formed inside the first sealing member 1205. Here, it is preferable that the first sealing member 1205 is made of a material which does not allow moisture or oxygen to pass through. Further, it is effective that a substance having effects of absorbing moisture or preventing oxidation is disposed in the space 1208.

In this respect, it is recommended that carbon films (specifically, a diamond like carbon film) 1209a, 1209b having a thickness of from 2 nm to 30 nm be formed as protective films on the obverse surface and the reverse surface of the covering member 1204. Such a carbon film prevents the entry of oxygen and water and mechanically protects the surface of the covering member 1204.

Further, after the covering member 1204 is bonded, a second sealing member 1206 is formed such that it covers the exposed surface of the first sealing member 1205. The second sealing member 1206 can be formed of the same material as the first sealing member 1205.

By sealing the EL element by the structure described above, the EL element can be completely shielded from the outside to prevent a substance for degrading the EL layer by oxidation such as moisture and oxygen from entering from the outside. Accordingly, this can provide a light emitting device having high reliability.

A shown in FIGS. 12A and 12B, a light emitting module with a pixel section, a driving circuit, and a sensor section which are formed on the same insulating body, and further provided with a TAB tape, is referred to as a light emitting module of a built-in driving circuit type in the present specification.

(Embodiment 11)

In the embodiment 10, the light emitting module of a built-in driving circuit type shown in FIGS. 12A and 12B is an example in which a pixel section and a driving circuit are integrally formed on the same insulating body, but the driving circuit may be provided as an external IC (integrated circuit). In this case, the structure will be shown in FIG. 13A.

Figure 13A:
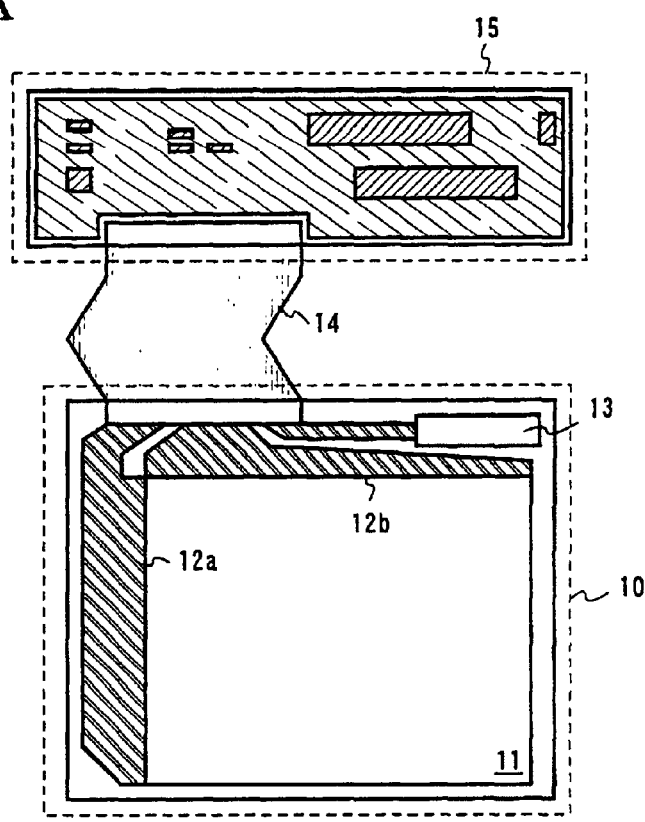
FIGS. 13A and 13B show the structure of a light emitting module of the type in which a driving circuit is built.

In the module shown in FIG. 13A, a TAB tape 14 is attached to a substrate (active matrix substrate) 10 (including a pixel section 11, wirings 12a, 12b and a sensor section 13) on which a pixel section including a TFT and an EL element is formed and a printed wiring board 15 is connected thereto through the TAB tape 14. Here, the circuit block diagram of the printed wiring board 15 is shown in FIG. 13B.

Figure 13B:
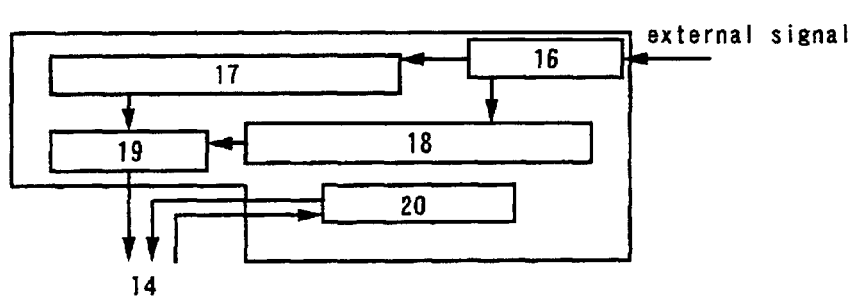

As shown in FIG. 13B, at least I/O ports (also referred to as an input/output section) 16, 19, a source signal side driving circuit 17, a gate signal side driving circuit 18 and an IC which functions as a correction circuit 20 are mounted in the printed wiring board 15.

As described above, a module with a configuration, in which a substrate with a pixel section and a sensor section which are formed on the same insulating body is provided with a TAB tape and a printed wiring board which functions as a driving circuit is provided via the TAB tape, is referred to as a light emitting module of an external driving circuit type in the present specification.

Further, in the module shown in FIG. 14A, a light emitting module of a built-in driving circuit type 30 (including a pixel section 31, a source signal side driving circuit 32, a gate signal side driving circuit 33, wirings 32a, 33a, a sensor section 34, and a TAB tape 35) is provided with a printed wiring board 36 via the TAB tape 35. Here, the circuit block diagram of the printed wiring board 36 is shown in FIG. 14B.

As shown in FIG. 14B, at least I/O ports 37, 40, a control section 38 and an IC which functions as a memory section 39 are provided in the printed wiring board 36. Here, the memory section 39 functions as the correction memory shown in FIG. 2 or FIG. 3 and luminance is adjusted by the correction circuit included in the control section 38. Also the control section 38 can control various kinds of signals such as a signal transmitted to the driving circuit or a timing signal.

As described above, a module with the configuration, in which a light emitting module of a built-in driving circuit type with a pixel section, a driving circuit and a sensor section which are formed on the same insulating body is provided with a printed wiring board which functions as a controller, is referred to as a light emitting module of an external controller type.

(Embodiment 12)

A light emitting module formed by the use of the present invention is applied to various kinds of electric appliances and a pixel section is used as an image display section. The electric appliances in accordance with the present invention include a video camera, a digital camera, a goggle type display (head-mounted display), a navigation system, an audio unit, a note-type personal computer, a game device, a portable device (a mobile computer, a portable telephone, a portable game device or an electronic book), and an image reproducing device provided with a recording medium. The specific examples of these electric appliances will be shown in FIGS. 15A to 16B.

Figure 15A:
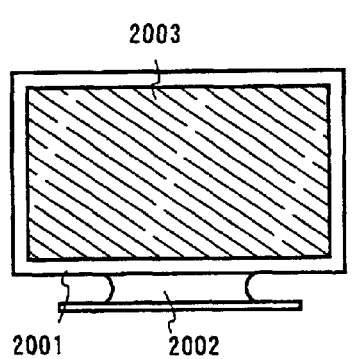
FIGS. 15A to 15F show a specific example of an electrical appliance.

FIG. 15A is an EL display and includes a box 2001, a support 2002, and a display section 2003. A light emitting module in accordance with the present invention can be used as the display section 2003. By applying the light emitting module in accordance with the present invention to the display section, it is possible to improve the visibility of the EL display and to reduce power consumption.

Figure 15B:
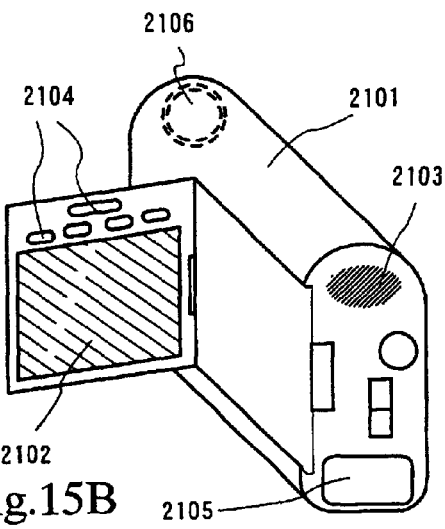

FIG. 15B is a video camera and includes a main body 2101, a display section 2102, a voice input section 2103, an operating switch 2104, a battery 2105, and an image receiving section 2106. The light emitting module in accordance with the present invention can be used as the display section 2102.

Figure 15C:
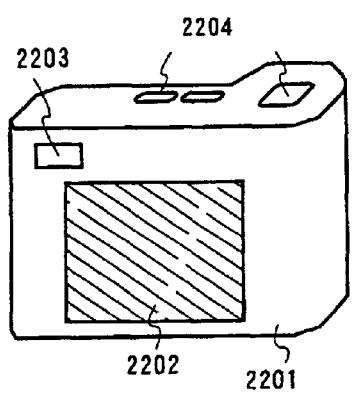

FIG. 15C is a digital camera and includes a main body 2201, a display section 2202, an eyepiece section 2203, and an operating switch 2204. The light emitting module in accordance with the present invention can be used as the display section 2202.

Figure 15D:
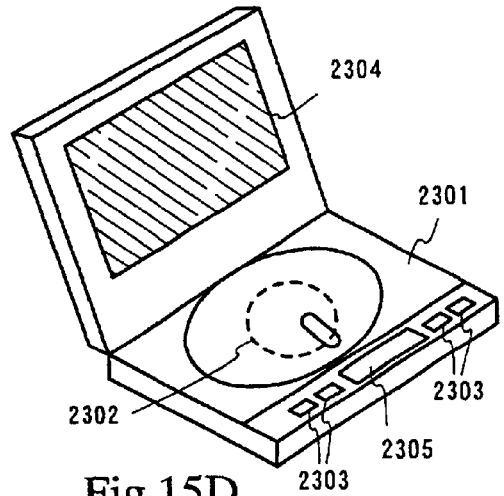

FIG. 15D is an image reproducing device provided with a recording medium (specifically, a DVD reproducing device) and includes a main body 2301, a recording medium (a CD, an LD, or a DVD) 2302, an operating switch 2303, a display section (a) 2304 and a display section (b) 2305. The display section (a) 2304 mainly displays image information and the display section (b) 2305 mainly displays textual information and a light emitting module in accordance with the present invention can be used as the display sections (a), (b). Here, the image reproducing device provided with the recording medium includes a CD reproduction device, a game device and the like.

Figure 15E:
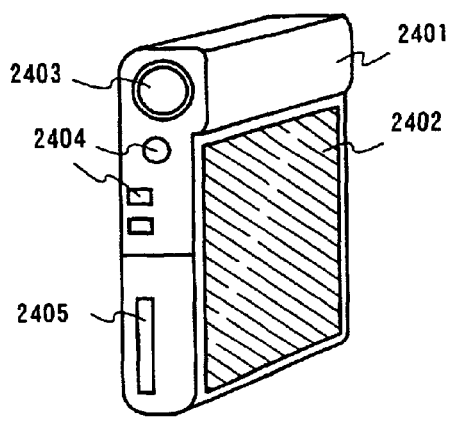

FIG. 15E is a portable (mobile) computer and includes a main body 2401, a display section 2402, a image receiving section 2403, an operating switch 2404, and a memory slot 2405. The light emitting module in accordance with the present invention can be used as the display section 2402. This portable computer can record information on a recording medium in which flash memories and non-volatile memories are integrated and can reproduce the information.

Figure 15F:
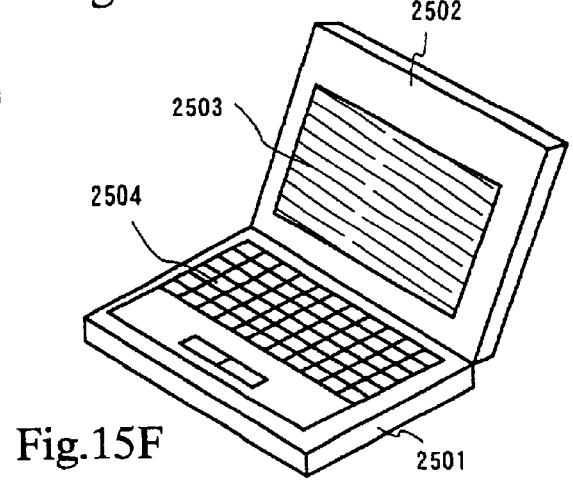

FIG. 15F is a personal computer and includes a main body 2501, a box 2502, a display section 2503, and a keyboard 2504. The light emitting module in accordance with the present invention can be used as the display section 2503.

Further, occasions are increasing when the above-mentioned electric appliances display information allotted through an electronic communication line such as an internet, a CATV (cable TV), and the like and, in particular, occasions are increasing when the appliances display motion pictures. In the case where a light emitting module using an EL element is used as a display section, it is possible to display motion pictures without delay because the EL element has a vary high response speed.

Still further, since the light emitting section consumes electric power in the light emitting module, it is preferable that information be displayed such that the light emitting section is made as small as possible. Accordingly, in the case a light emitting module is used as a display section mainly displaying textual information such as a portable information terminal, in particular, a portable telephone, an audio unit, or the like, it is preferable that the light emitting module be driven in such a way that textual information is formed of the light emitting section against the background of non-light emitting section.

Figure 16A:
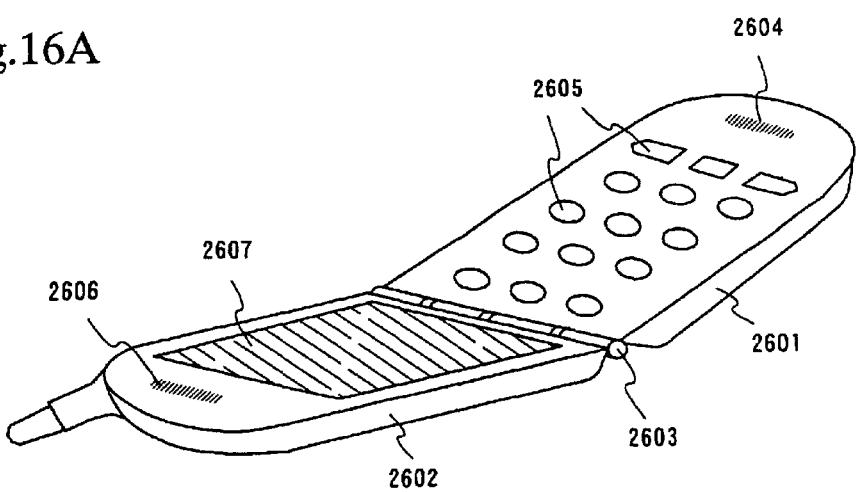
FIGS. 16A and 16B show a specific example of an electrical appliance.

Here, FIG. 16A shows a portable telephone and has a key operating section (operation section) 2601 and an information displaying section (information display section) 2602 which is connected to the operation section 2601 with a connection section 2603. Also, the operation section 2601 is provided with a voice input section 2604 and an operating key 2605 and the information display section 2602 is provided with a voice output section 2606 and a display section 2607.

The light emitting module in accordance with the present invention can be used as the display section 2607. In this respect, in the case where the light emitting module is used as the display section 2607, displaying white letters against a black background can reduce power consumption of the portable telephone.

In the case of the portable telephone shown in FIG. 16A, it is also possible to use the portable telephone as a certification system terminal for certifying a user by reading his fingerprint or palm by building a sensor made of a CMOS circuit (CMOS sensor) in the light emitting module used as the display section 2604. Further, it is possible to read the brightness (illuminance) of the outside and to emit light such that information is displayed in a set contrast.

Still further, it is possible to reduce the power consumption of the portable telephone by decreasing the luminance of the display section 2604 while the operating switch 2605 is being used and increasing the luminance after the use of the operating switch is finished. Still further, it is possible to reduce the power consumption of the portable telephone by increasing the luminance of the display section 2604 when a signal is received and decreasing the luminance during a telephone conversation. Still further, it is possible to reduce the power consumption of the portable telephone by providing it with a function of turning off the display by a time control unless reset while it is continuously used. Here, these functions may be manually controlled.

Figure 16B:
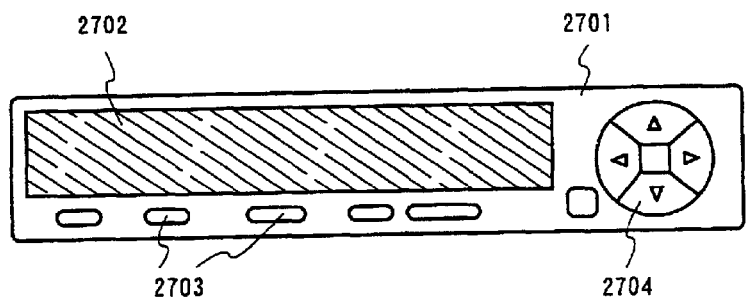

Still further. FIG. 16B shows an audio unit mounted in a motor vehicle and includes a box 2701, a display section 2702, and operating switches 2703, 2704. The light emitting module in accordance with the present invention can be used as the display section 2702. While an audio unit (car audio unit) mounted in a motor vehicle is shown as an example of the audio unit in the present embodiment, the light emitting module in accordance with the present invention can be applied to an audio unit mounted in the house (audio component). Here, in the case where the light emitting module is used as the display section 2704, it is possible to reduce power consumption by displaying white letters against a black background.

As described above, the present invention has a wide range of application and can be applied to various kinds of electric appliances. As a result, it is possible to improve the visibility of the display section of the electric appliance and to reduce the power consumption by using a light emitting module which is excellent in visibility in the bright environment and the dark environment and further can reduce power consumption to a minimum in the dark environment. Further, the light emitting module including any of the configurations of from the embodiment 1 to the embodiment 11 may be applied to the electric appliances of the present embodiment.

(Effects of the Invention)

According to the present invention, environmental illuminance is sensed by a sensor section provided in a light emitting device, and the correct luminance of an EL element and a correction signal necessary for obtaining the correct luminance are calculated by a correction circuit based on the output signal of the sensor section. Then, the amount of current flowing through the EL element is corrected based on the correction signal to keep the ratio of the luminance of the EL element to the environmental illuminance at a constant value.

As a result, according to the present invention, it is possible to obtain a light emitting module which is excellent in visibility in the bright environment and in the dark environment and can reduce power consumption to a minimum in the dark environment. Therefore, an electric appliance employing the light emitting module in accordance with the present invention can have excellent visibility in a display section and reduce power consumption.

What is claimed is:

1. A light emitting module comprising:
   a light emitting device comprising a pixel section and a sensor section which are formed on a same insulating body; and
   a correction circuit connected to the light emitting device,
   wherein said correction circuit adjusts luminance of a light emitting element of the pixel section according to environmental illuminance sensed by the sensor section and for keeping a ratio of the luminance to the environmental illuminance at a constant value by the correction circuit,
   wherein said sensor section is disposed outside said pixel section, and
   wherein said sensor section comprises at least one optical sensor comprising a photodiode, a reset TFT, a buffer TFT and a constant current TFT.

2. A light emitting module according to claim 1, wherein the sensor section includes a thin film photodiode.

3. A light emitting module according to claim 1, wherein the correction circuit comprises an arithmetic circuit for calculating the luminance of the light emitting element based on a signal transmitted from the sensor section.

4. A light emitting module according to claim 2, wherein the light emitting element and the thin film diode are electrically connected to a transistor.

5. A light emitting module according to claim 4, wherein the transistor is a bottom gate type thin film transistor.

6. A light emitting module according to claim 1, wherein the light emitting element is an EL element.

7. A light emitting module according to claim 1, wherein the light emitting module is included in one of a portable telephone, a video camera, a digital camera, a computer, and a portable telephone.

8. A light emitting module according to claim 1, wherein said sensor section comprises at least one optical sensor comprising a photodiode, a first reset TFT, a buffer TFT, a load capacitance, and a second reset TFT.

9. A light emitting module according to claim 1, wherein said sensor section comprises at least one optical sensor comprising a photodiode, a reset TFT, a buffer TFT, and a load resistance or a load capacitance.

10. A light emitting module according to claim 1, wherein said sensor section comprises at least one optical sensor comprising a photodiode and a reset TFT.

11. A light emitting module comprising:
    a light emitting device comprising a pixel section and a sensor section sensing environmental illuminance which are formed on a same insulating body; and
    a correction circuit connected to the light emitting device,
    wherein the pixel section comprises a thin film light emitting element,
    wherein the sensor section includes a thin film photodiode,
    wherein the sensor section is disposed outside said pixel section, and
    wherein said sensor section comprises at least one optical sensor comprising a photodiode, a reset TFT, a buffer TFT and a constant current TFT.

12. A light emitting module according to claim 11, wherein the correction circuit comprises an arithmetic circuit for calculating the luminance of the light emitting element based on a signal transmitted from the sensor section.

13. A light emitting module according to claim 11, wherein the light emitting element and the thin film photodiode are electrically connected to a transistor.

14. A light emitting module according to claim 13, the transistor is a bottom gate type thin film transistor.

15. A light emitting module according to claim 11, wherein the light emitting element is an EL element.

16. A light emitting module according to claim 11, wherein the light emitting module is included in one of a portable telephone, a video camera, a digital camera, a computer, and portable telephone.

17. A light emitting module according to claim 11, wherein said sensor section comprises at least one optical sensor comprising a photodiode, a first reset TFT, a buffer TFT, a load capacitance, and a second reset TFT.

18. A light emitting module according to claim 11, wherein said sensor section comprises at least one optical sensor comprising a photodiode, a reset TFT, a buffer TFT, and a load resistance or a load capacitance.

19. A light emitting module according to claim 11, wherein said sensor section comprises at least one optical sensor comprising a photodiode and a reset TFT.

20. A light emitting module comprising:
   a light emitting device comprising a pixel section, a driving circuit, and a sensor section sensing environmental illuminance which are formed on a same insulating body; and
   a correction circuit connected to the light emitting device,
   wherein the pixel section includes a thin film light emitting element,
   wherein the sensor section includes a thin film photodiode,
   wherein said sensor section is disposed outside said pixel section, and
   wherein said sensor section comprises at least one optical sensor comprising a photodiode, a reset TFT, a buffer TFT and a constant current TFT.

21. A light emitting module according to claim 20, wherein the correction circuit comprises an arithmetic circuit for calculating the luminance of the light emitting element based on a signal transmitted from the sensor section.

22. A light emitting module according to claim 20, wherein the light emitting element and the thin film photodiode are electrically connected to a transistor.

23. A light emitting module according to claim 22, wherein the transistor is a bottom gate type thin film transistor.

24. A light emitting module according to claim 20, wherein the light emitting element is an EL element.

25. A light emitting module according to claim 20, wherein the light emitting module is included in one of a portable telephone, a video camera, a digital camera, a computer, and a portable telephone.

26. A light emitting module according to claim 20, wherein said sensor section comprises at least one optical sensor comprising a photodiode, a first reset TFT, a buffer TFT, a load capacitance, and a second reset TFT.

27. A light emitting module according to claim 20, wherein said sensor section comprises at least one optical sensor comprising a photodiode, a reset TFT, a buffer TFT, and a load resistance or a load capacitance.

28. A light emitting module according to claim 20, wherein said sensor section comprises at least one optical sensor comprising a photodiode and a reset TFT.

29. A method for driving a light emitting module which comprises a light emitting device comprising a pixel section and a sensor section disposed outside said pixel section which are formed on a same insulating body and a correction circuit connected to the light emitting device, said method comprising the steps of:
   adjusting luminance of the light emitting element of the pixel section according to environmental illuminance sensed by the sensor section; and
   keeping a ratio of the luminance to the environmental illuminance at a constant value by correction circuit,
   wherein said sensor section comprises at least one optical sensor comprising a photodiode, a reset TFT, a buffer TFT and a constant current TFT.

30. An electronic device comprising at least one electro luminescence display device, said display device comprising:
   a substrate;
   at least one pixel comprising an electro luminescence element over said substrate;
   at least one first thin film transistor disposed at said pixel for selecting said pixel;
   at least one second thin film transistor disposed at said pixel for supplying an electric current through said electro luminescence element;
   a data signal side driver circuit for supplying a data signal to said pixel;
   a gate signal side driver circuit electrically connected to a gate electrode of said first thin film transistor, wherein each of said data signal side driver circuit and said gate signal side driver circuit comprises third thin film transistors formed over said substrate; and
   a sensor section for sensing a light intensity of an environment formed outside said pixel over said substrate, wherein said sensor comprises a photodiode and at least one fourth thin film transistor;
   a correction circuit for receiving an output signal form said sensor section and correcting luminance of said electro luminescence element in accordance with said output signal.

31. An electronic device according to claim 30, wherein said correction circuit is provided over said substrate.

32. An electronic device according to claim 30 wherein said electric device is one of a portable telephone, a video camera, a digital camera, a computer, and portable telephone.

33. An electronic device comprising:
   a substrate;
   at least one pixel comprising an electro luminescence element over said substrate;
   at least one first thin film transistor disposed at said pixel for selecting said pixel;
   at least one second thin film transistor disposed at said pixel for supplying an electric current through said electro luminescence element;
   at least one third thin film transistor disposed at least one driver circuit over said substrate;
   at least one fourth thin film transistor disposed at a sensor section over said substrate;
   a first insulating layer over said first thin film transistor, said second thin film transistor, said third thin film transistor and said fourth thin film transistor;
   a second insulating layer over said first insulating layer; and a photodiode electrically connected with said fourth thin film transistor through said first insulating layer and said second insulating layer, and disposed at said sensor section over said second insulating layer, wherein said sensor section senses environmental illuminance.

34. A electronic device according to claim 33 further comprising a correction circuit over said substrate.

35. An electronic device comprising:

a substrate;

at least one pixel comprising an electro luminescence element over said substrate;

at least one first thin film transistor disposed at said pixel for selecting said pixel;

at least one second thin film transistor disposed at said pixel for supplying an electric current through said electro luminescence element;

at least one third thin film transistor disposed at least one driver circuit over said substrate;

at least one fourth thin film transistor disposed at a sensor section over said substrate;

a first insulating layer over said first thin film transistor, said second thin film transistor, said third thin film transistor and said fourth thin film transistor;

a photodiode electrically connected with said fourth thin film transistor through said first insulating film, disposed at said sensor section over said first insulating layer; and a second insulating layer over said photodiode, wherein said sensor section senses environmental illuminance.

36. A electronic device according to claim 35 further comprising a correction circuit over said substrate.

* * * * *